United States Patent
Tanaka et al.

(10) Patent No.: US 6,480,418 B2
(45) Date of Patent: Nov. 12, 2002

(54) SEMICONDUCTOR NON-VOLATILE STORAGE

(75) Inventors: Toshihiro Tanaka, Akiruno; Yutaka Shinagawa, Iruma; Kazuyoshi Shiba, Kodaira; Kazufumi Suzukawa, Ichikawa; Masamichi Fujito, Kodaira; Takayuki Oshima, Oume; Sonoko Abe, Higashiyamato; Kiyoshi Matsubara, Kiyose, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/951,979

(22) Filed: Sep. 14, 2001

(65) Prior Publication Data

US 2002/0008992 A1 Jan. 24, 2002

Related U.S. Application Data

(63) Continuation of application No. 09/627,411, filed on Jul. 27, 2000, now Pat. No. 6,307,780, which is a continuation of application No. 09/219,435, filed on Dec. 23, 1998, now Pat. No. 6,122,196.

(30) Foreign Application Priority Data

Dec. 26, 1997 (JP) .............................................. 9-359258

(51) Int. Cl.[7] .............................................. G11C 16/04
(52) U.S. Cl. .............................. 365/185.13; 365/185.11
(58) Field of Search ........................ 365/185.13, 185.11, 365/185.2, 230.03, 52, 63

(56) References Cited

U.S. PATENT DOCUMENTS

| 5,557,124 A | 9/1996 | Roy et al. .............. 365/285.21 |
| 5,615,153 A | 3/1997 | Yiu et al. .............. 365/185.19 |
| 5,822,248 A | 10/1998 | Satori et al. ........... 365/185.06 |

FOREIGN PATENT DOCUMENTS

| JP | 414871 | 1/1992 |
| JP | 6077437 | 3/1994 |
| JP | 7153857 | 6/1995 |

OTHER PUBLICATIONS

1991 IEEE Solid–Stat e Circuits Conference, Digest of Technical Papers, pp. 260–261.
1995 IEEE Solid–Stat e Circuits Conference, Digest of Technical Papers, pp. 124–125.

*Primary Examiner*—Vu A. Le
(74) *Attorney, Agent, or Firm*—Antonelli, Terry, Stout & Kraus, LLP

(57) ABSTRACT

The present invention proposes a non-volatile semiconductor storage, comprising a plurality of main bit lines, a plurality of sub bit lines connected to the main bit lines, and a plurality of memory cell arrays, each including a plurality of non-volatile semiconductor memory cells disposed like an array. Each of those memory cells has a source terminal, a drain terminal, and a control gate, and each source-drain path is connected to a sub bit line. Between a main bit line and a sub bit line connected to the main bit line is disposed the source-drain path of a first transistor, and the source-drain path of a second transistor is connected to the sub bit line.

2 Claims, 18 Drawing Sheets

SEMICONDUCTOR NON-VOLATILE STORAGE

This is a continuation of application Ser. No. 09/627,411, filed Jul. 27, 2000 now U.S. Pat. No. 6,307,780; which is a continuation of application Ser. No. 09/219,435, filed Dec. 23, 1998, now U.S. Pat. No. 6,122,196.

BACKGROUND OF THE INVENTION

1. Field of the Invention

The present invention relates to a technology for increasing the speed of reading operations in a semiconductor non-volatile storage, more particularly to an effective technology to be adopted for an electrically rewritable flash memory and a single chip microcomputer incorporating such a flash memory.

2. Description of the Related Art

When connecting memory cells to each other on a memory array provided in a semiconductor non-volatile storage such as a flash memory, a technology for forming main bit and sub bit lines hierarchically will be very effective to reduce the parasitic capacity of each of those bit lines, as well as increase the speed of reading operations.

Such a technology is disclosed in the official gazette of Unexamined Published Japanese Patent Application No.Hei-4-14871. The technology is referred to as a DINOR type memory cell connection, in which bit lines are formed hierarchically. The official gazette of Unexamined Published Japanese Patent Application No.Hei-6-077437 has disclosed an AND memory cell connection in which bit and source lines are formed hierarchically and the official gazette of Unexamined Published Japanese Patent Application No.Hei-7-153857 has disclosed an HICR type memory cell connection in which bit and source lines are formed hierarchically, and further a source line is used commonly by adjacent memory cell groups.

A differential sense amplifying method is also effective for increasing the speed of reading operations in a semiconductor non-volatile storage such as a flash memory. Hereunder, description will be made for how to wire read bit lines (hereafter, to be referred to as data lines) and reference bit lines (hereafter, to be referred to as reference lines) assumed as differential inputs, as well as a conventional technology for generating a current difference (voltage difference) between data line and reference line.

Firstly, there is a well-known example described on pages 260–261 of the digest of technical papers at 1991 IEEE INTERNATIONAL SOLID-STATE CIRCUITS CONFERENCE.

This first well-known example is about memory arrays including a normal memory array to which data lines are connected, as well as memory arrays provided with a dummy bit line used as a dedicated reference line respectively. The sense amplifying method adopted for this first example is none other than a loop-back bit line method. In the loop-back bit line method (sense amplifying method), a differential input is a sense amplifying sensitivity, which, at the reference line side, takes a half voltage of the voltage in the "1" and "0" sense amplifiers of the memory cells used as data lines.

The second well-known example is described on pages 124–125 of the digest of technical papers at 1995 IEEE INTERNALTIONAL SOLID-STATE CIRCUITS CONFERENCE.

In the second well-known example, a differential method is adopted for reading sectors, which is executed as follows.

The memory mat uses an open bit line to connect the sense amplifier. Only data lines are pre-charged and the pre-charging level is held according to the information of an object memory cell or the object memory cell is discharged, then a half voltage of the pre-charging voltage is supplied to each bit line at the reference line side. In a random byte reading operation in the same well-known example, in addition to the memory mat, a dummy memory cell is used as a dedicated reference line. A half current of the reference current is flown in the dummy memory cell, thereby obtaining a differential input.

On the other hand, the official gazettes of Unexamined Published Japanese Patent No.Hei-4-14871, No.Hei-6-077437, and No.Hei-7-153857 have disclosed memory cell connection methods for flash memories, in which a transistor SiD-MOS used for connecting a main bit line to a sub bit line, is composed of a transistor that can apply a high voltage. This is because a high voltage is applied to the drain or source terminal of an object memory cell in writing operation, thereby rewriting the threshold level voltage of the memory cell. Consequently, the transistor SiD-MOS can supply only a low current, delaying the appearance of the waveforms of select and non-select signals.

The transistor SiD-MOS connecting both bit and sub bit lines functions (in the on-state) for pre-charging, sensing, and discharging of the bit line, in reading operation.

FIG. 2 shows the waveform of the gate signal SiD (i=0, i=1) of the transistor SiD-MOS connecting both main bit and sub bit lines, as well as the function of the transistor SiD-MOS in reading operation. Since the gate signal SiD drives only transistors SiD-MOS matching in the number of bit lines (a few thousands of bits), the waveform of the SiD signal is smooth both at rising and falling parts. If a sub bit line is pre-charged while the transistor SiD-MOS connecting a main bit line and the sub bit line incompletely, the voltage of the sub bit line rises. In the next read cycle, therefore, a voltage difference is generated between the read bit line and the reference bit line of the differential sense amplifier. This voltage different disables stable and fast read operations. Consequently, the pre-charging must be suspended until the SiD signal is deactivated. The suspended time is thus regarded as an overhead time.

Furthermore, when both main bit and sub bit lines are discharged after sensing, the gate signal SiD of the transistor SiD-MOS is switched to the reverse state. The sub bit line cannot be discharged at this time, however, unless the SiD signal is activated.

Consequently, the gate signal switching time (activated time and deactivated time) of the transistor SiD-MOS is regarded as an overhead time.

The conventional technologies ISSCC91 (pp. 260–261) and ISSCC95 (pp. 124–125) that use a differential sense amplifier respectively has proposed a loop-back bit line method, an open bit line method, and a reference line method. The loop-back bit line method uses a dummy bit line to which a dedicated reference line is connected, in addition to a memory mat. The open line method allows a memory mat to be opened to a sense amplifier using an open bit line. The dedicated reference line method uses a dummy memory cell dedicated to a reference line. However, since the column configuration (Y direction) differs between data line and reference line, a difference is also generated between them with respect to both parasitic capacity and parasitic resistance. In addition, since they use different control signals respectively, timings are also varied between them. Unless both data and reference lines exist in the same memory array, therefore, their noises are varied between them. In addition, since a memory cell is fixed for a reference line, the memory cell is always affected by read disturbance. Those are all factors hindering an increase of the speed of reading from the semiconductor non-volatile.

SUMMARY OF THE INVENTION

Under such the circumstances, it is an object of the present invention to provide a semiconductor non-volatile storage that can read data fast, as well as a data processor incorporating such a semiconductor non-volatile storage in it. Concretely, it is an object of the present invention to provide a semiconductor non-volatile storage allowing memory cells to be connected to each other by forming main bit and sub bit lines hierarchically and using a differential sense amplifier, as well as provide a data processor incorporating such a semiconductor non-volatile storage in it so as to make the read operation faster and faster.

In order to solve the above conventional problems, the semiconductor non-volatile in the embodiment of the present invention is composed so that the storage comprises main bit lines, sub bit lines connected to the main bit lines respectively, memory cell arrays, in each of which a plurality of non-volatile semiconductor memory cells are disposed like an array, wherein each of the memory cells includes a source, a drain, and a control gate and the source-drain path is connected to a sub bit line. In addition, the source-drain path of a first transistor is disposed between a main bit line and a sub bit line connected to the main bit line, and the source-drain path of a second transistor is coupled to the sub bit line.

In this case, the first and second transistors should preferably be turned on/off complementarily to each other. One main bit line may be connected to a plurality of sub bit lines.

The operation of the semiconductor non-volatile storage of the present invention will be described briefly below. The operation will also be described later more in detail. While a first transistor is set in the first state and a second transistor is set in the second state, an object memory cell is sensed. When the first transistor is set in the second state and the second transistor is set in the first state, the potential of the object sub bit line is changed.

Furthermore, when the first transistor is set in the first state and the second transistor is set in the second state, the potential of the object main bit line is changed.

A typical embodiment of the present invention will be summarized briefly as follows.

At first, the present invention has proposed the following new memory cell connection. In addition to a transistor SiD-MOS used to connect a main bit line to a sub bit line, another transistor SiDB-MOS is connected to the sub bit line. The transistor SiDB-MOS is used to discharge the sub bit line. The gate signal SiDB of the transistor SiDB-MOS is used as a complementary signal of the gate signal SiD of the transistor SiD-MOS in which main bit and sub bit lines are formed hierarchically.

FIG. 3 shows the waveform of the gate signal SiD (i=0, i=1) of a transistor SiD-MOS of the present invention, which is used to connect a main bit line to a sub bit line in order to describe the function of the gate signal SiDB (i=0, i=1) of the transistor SiDB-MOS used to discharge the sub bit line in reading operation. The transistor SiDB-MOS is also used to increase the speed of read operations.

Since a transistor SiDB-MOS used to discharge a sub bit line is provided newly, the sub bit line discharging time can be assigned for an operation other than the read cycle. A time assigned for another operation other than the selected cycle can thus be used for discharging the sub bit line. Consequently, it is possible to start pre-charging of both main bit and sub bit lines before the gate terminal signal of the transistor SiD-MOS is selected. Since the semiconductor non-volatile storage of the present invention is provided with a function for such pre-charging (hereafter, to be referred to as precedence pre-charge), the storage can shorten the read operation cycle, assuring fast read operations.

Furthermore, two independent gate terminals are provided for a transistor SiD-MOS in which main bit and sub bit lines are formed hierarchically. The data and reference lines of the differential sense amplifier input signal are disposed in the same memory array and a memory cell group close to another memory cell group used as a data line is used as a reference line. The same gate signal SiD of the transistor SiD-MOS is used to select memory cell groups of both data line and reference line.

The semiconductor non-volatile storage of the present invention is also provided with a read function, in which the potential of the bit lines adjacent to both of data and reference lines is defined as the ground voltage VSS.

The differential sense amplifier is provided with a function for flowing an about ½ current of that of a memory cell to a data line in the direction for denying the current of the memory cell while or after both data and reference lines are pre-charged. This function can thus solve the factor that hinders an increase of the reading speed described above.

As another memory cell connection method, the voltage of the source terminal of a transistor SiDB-MOS used to discharge an object sub bit line is set equally to the voltage of the drain terminal of an object memory cell in reading operation. The voltage of the source terminal of the memory cell is set equally to the ground voltage for reading data from the semiconductor non-volatile storage of the present invention. This function can omit pre-charging, thereby making the reading operation faster.

As another memory cell connection method, the semiconductor non-volatile storage of the present invention is provided with a reading function, which is used as follows. The voltage of the source terminal of a transistor SiDB-MOS used to discharge an object sub bit line is set equally to the ground voltage and the voltage of the source terminal of an object memory cell is set equally to the voltage of the drain terminal of the memory cell in reading operation. This function can omit discharging, thereby making the reading operation faster.

The semiconductor non-volatile storage of the present invention is also provided with a function for preventing flow of a charging/discharging current to an object memory cell. The function is used as follows; a transistor SiDB-MOS disposed between a sub bit line and the source terminal of a memory cell is used for rewriting (writing, erasing) the memory cell. While a voltage is applied to the drain or source terminal of the memory cell, the transistor SiDB-MOS connects the drain terminal to the source terminal of the memory cell, thereby it is prevented that the charging/discharging current equivalent to the total parasitic capacity of both drain and source of the memory cell flows in the memory cell.

BRIEF DESCRIPTION OF THE DRAWINGS

FIG. 12 is a circuit diagram indicating how memory cells are connected to each other when the present invention is applied to the memory cell connection method AND.

DESCRIPTION OF THE PREFERRED EMBODIMENT

Hereunder, the embodiment of the present invention will be described in detail with reference to the accompanying drawings.

Figure 1:
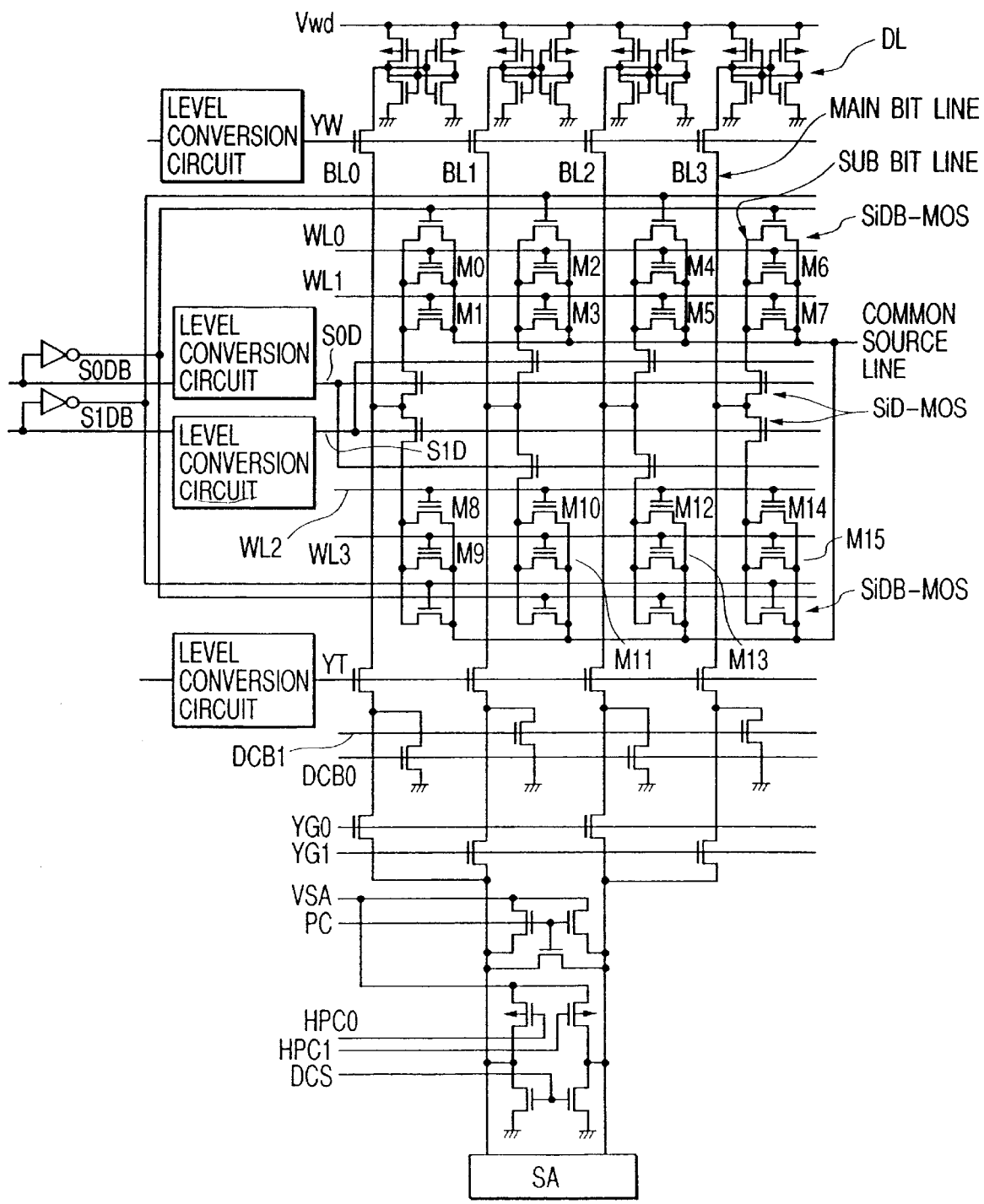
FIG. 1 is a connection diagram indicating how memory cells are connected to each other and how each memory array is composed, as well as the relationship between the differential sense amplifier and other parts for describing the principle of the present invention.
Figure 2:
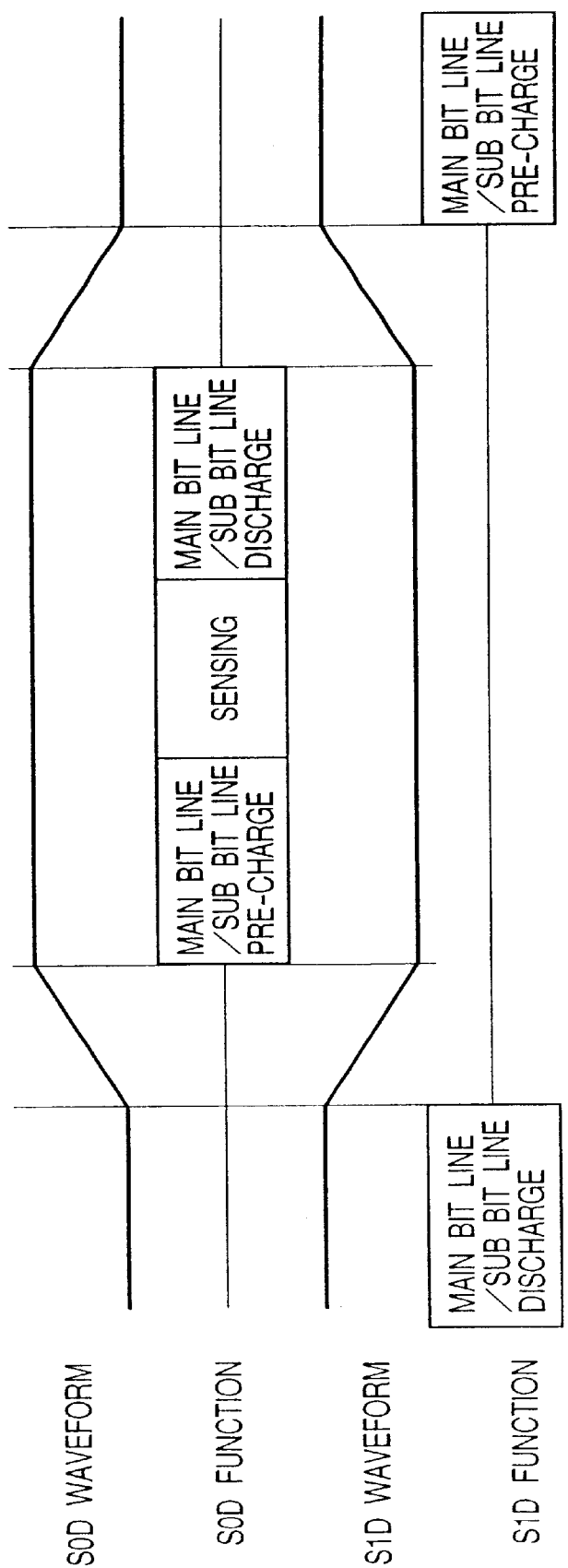
FIG. 2 is a schematic view of the waveform and the function of the gate signal SiD of a transistor used for connecting a bit line to a sub bit line in a conventional read operation.
Figure 3:
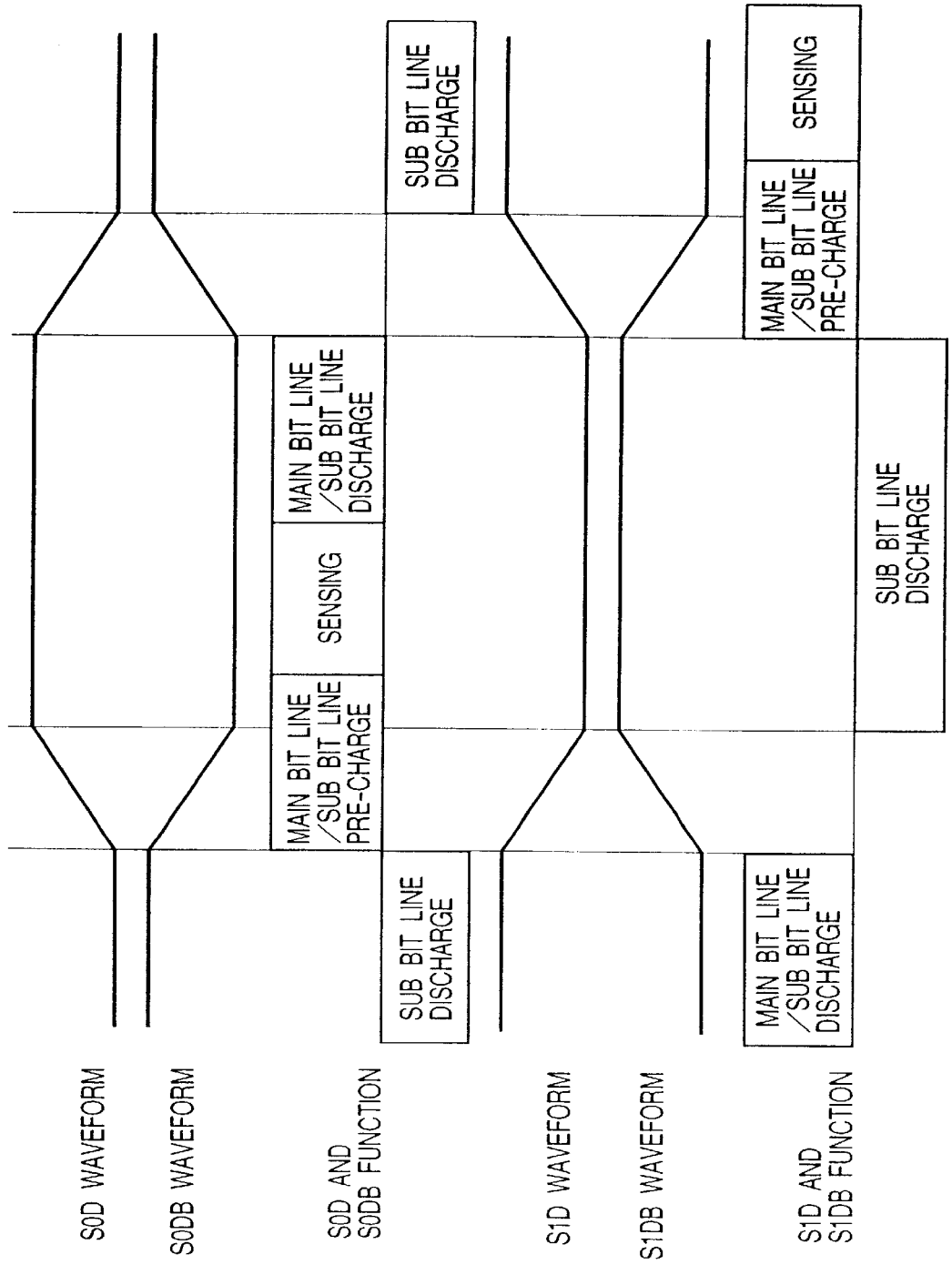
FIG. 3 is a schematic view of the waveform and the function of the gate signal SiD of the transistor SiDB-MOS used for discharging a sub bit line in the embodiment of the present invention.
Figure 4:
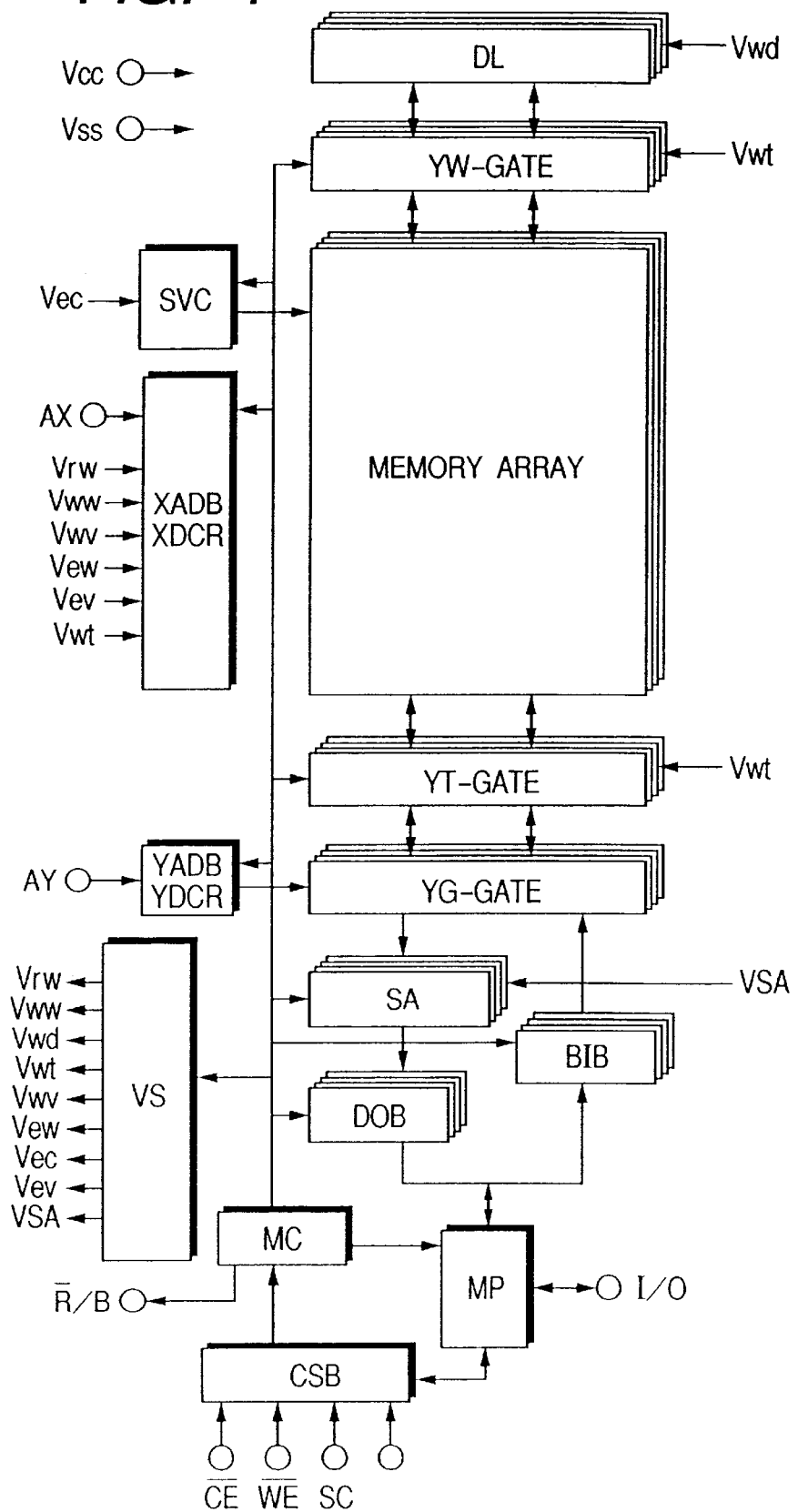
FIG. 4 is a functional block diagram of a semiconductor non-volatile storage in the embodiment of the present invention.
Figure 5:
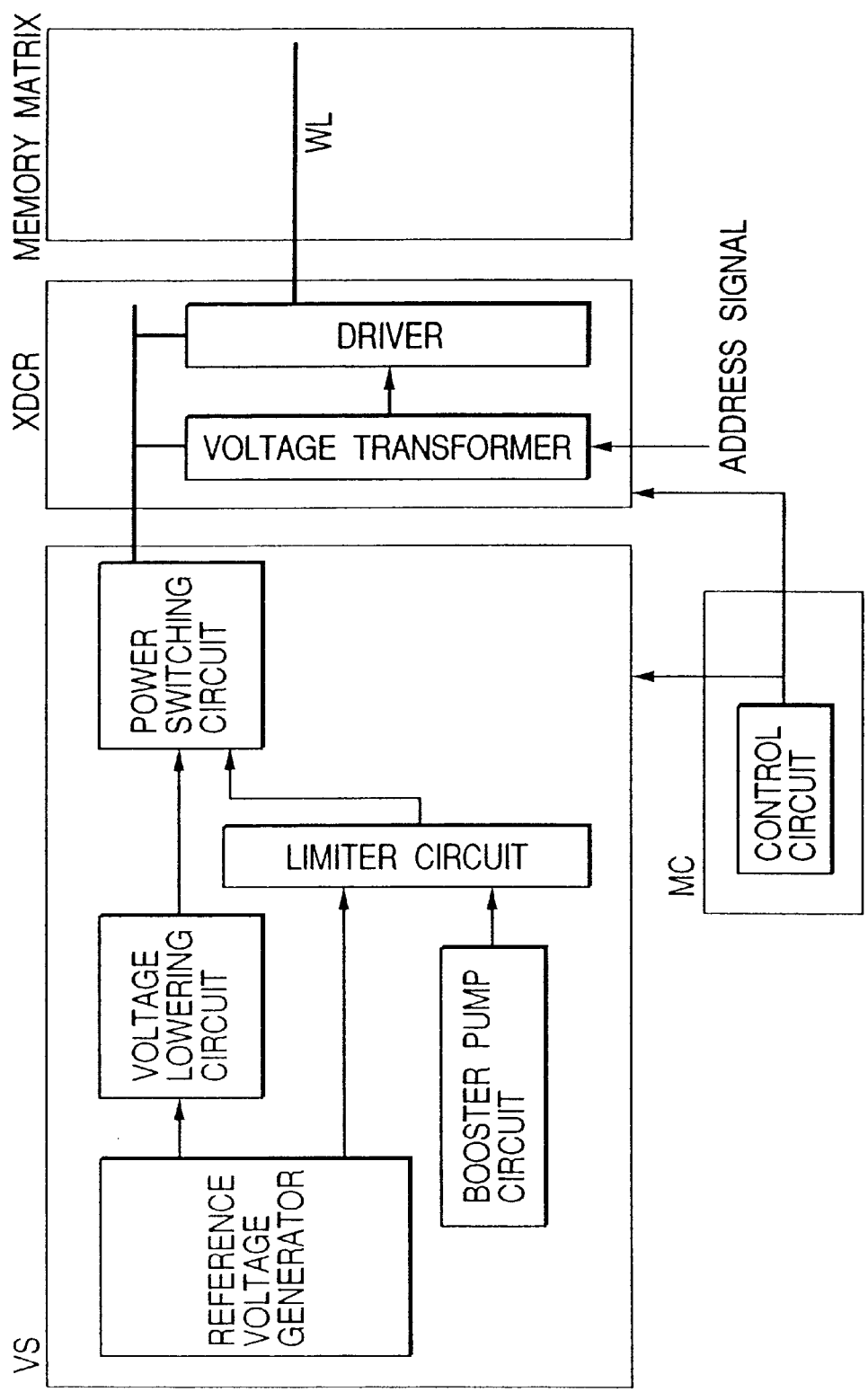
FIG. 5 is a functional block diagram of a power source circuit provided in the semiconductor non-volatile storage in the embodiment of the present invention.
Figure 6:
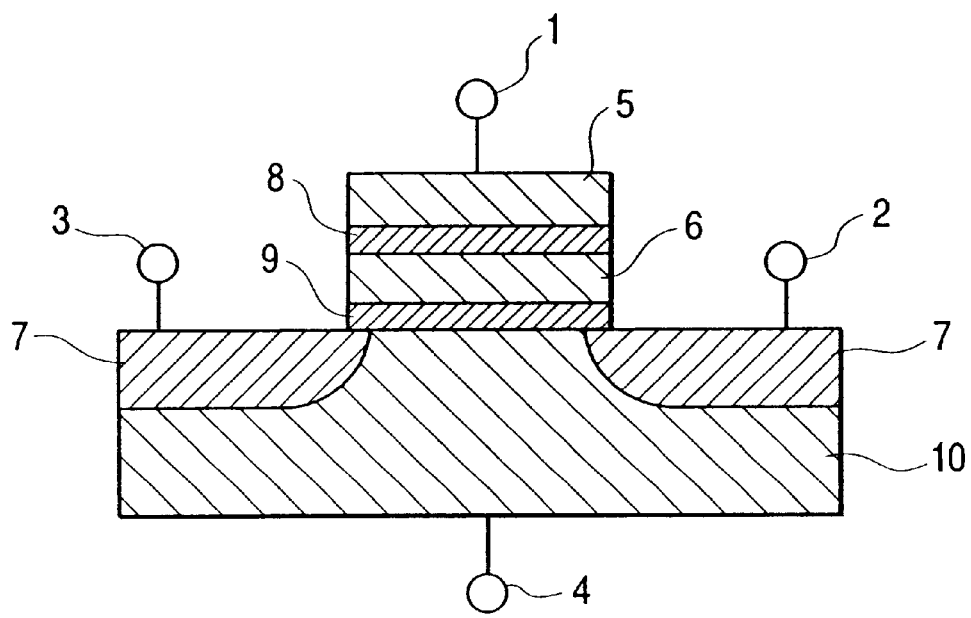
FIG. 6 is a cross sectional view of a transistor used for a semiconductor non-volatile memory cell (stack type).
Figure 7:
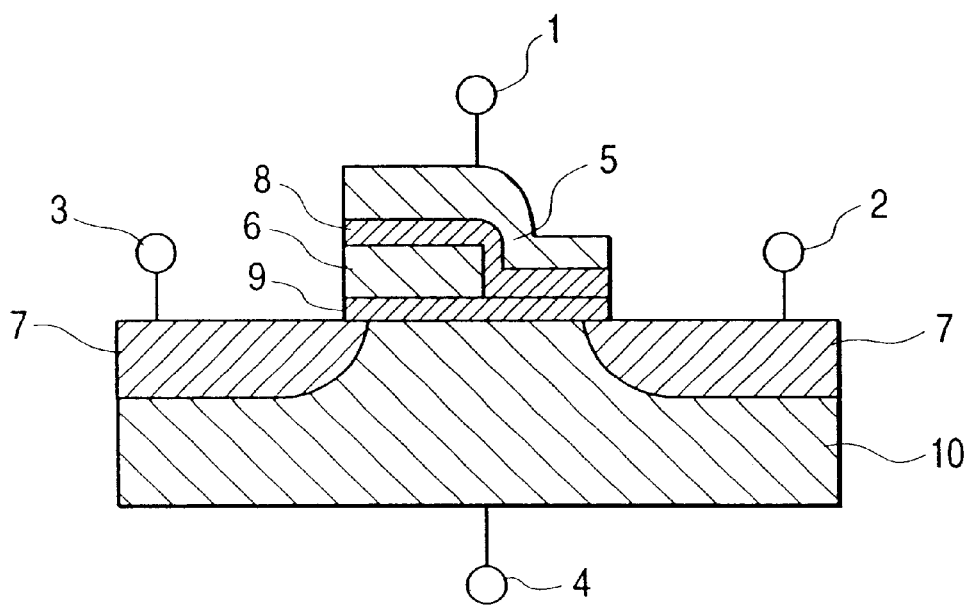
FIG. 7 is a cross sectional view of a transistor used for a semiconductor non-volatile memory cell (split type) in the embodiment.
Figure 8:
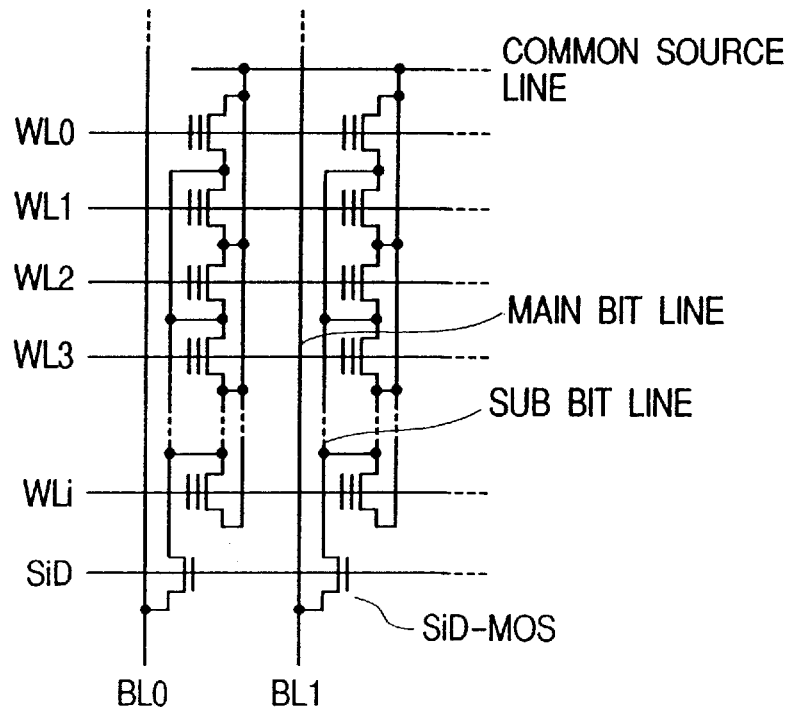
FIG. 8 is a circuit diagram indicating how memory cells are connected in a conventional memory matrix (DINOR).
Figure 9:
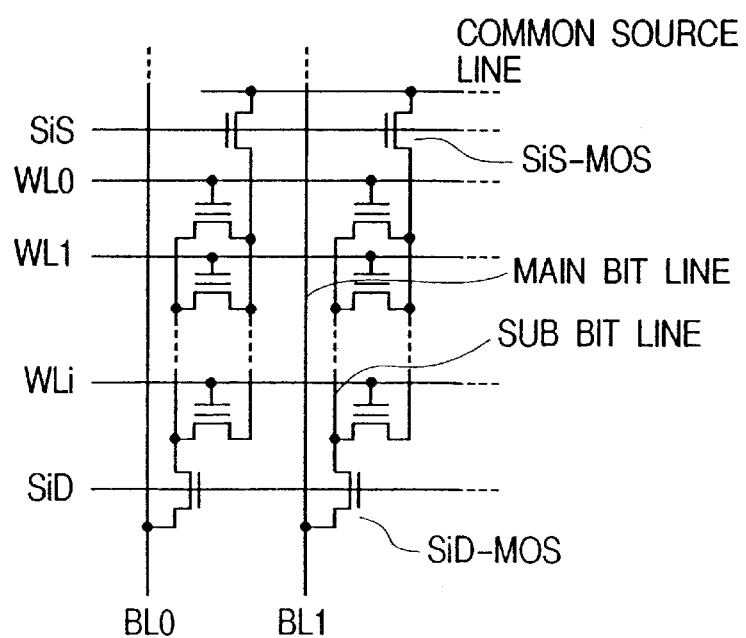
FIG. 9 is a circuit diagram indicating how memory cells are connected in a conventional memory matrix (AND).
Figure 10:
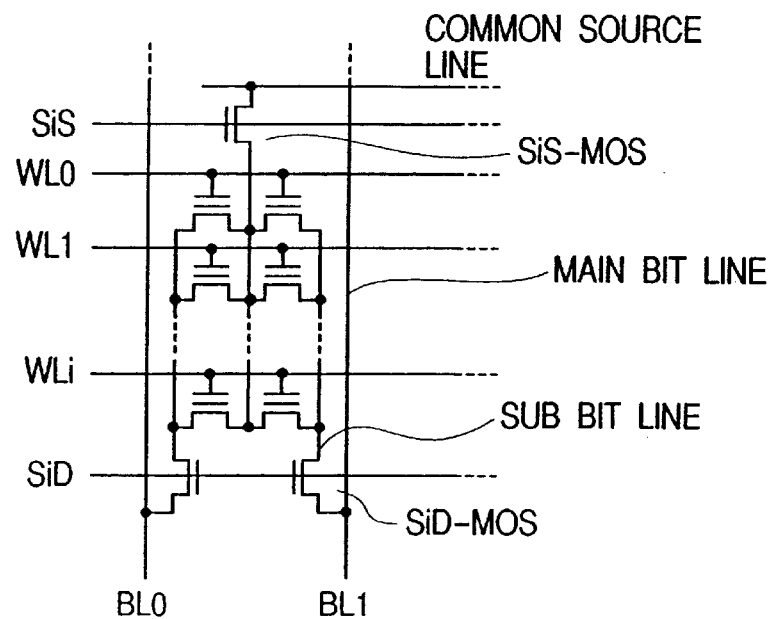
FIG. 10 is a circuit diagram indicating how memory cells are connected in a conventional memory matrix (HICR)
Figure 11:
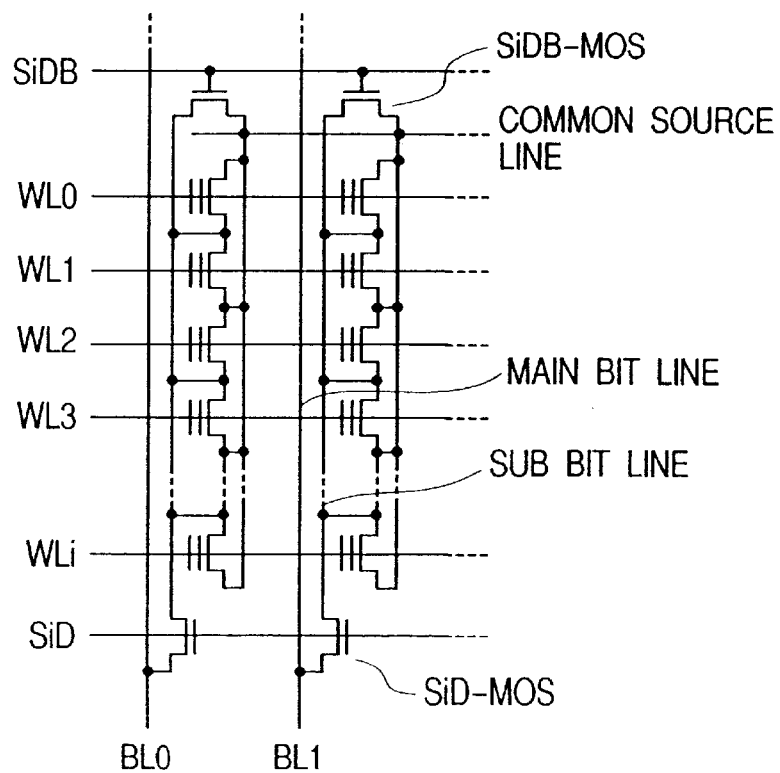
FIG. 11 is a circuit diagram indicating how memory cells are connected to each other when the present invention is applied to the memory cell connection method DINOR.
Figure 12:
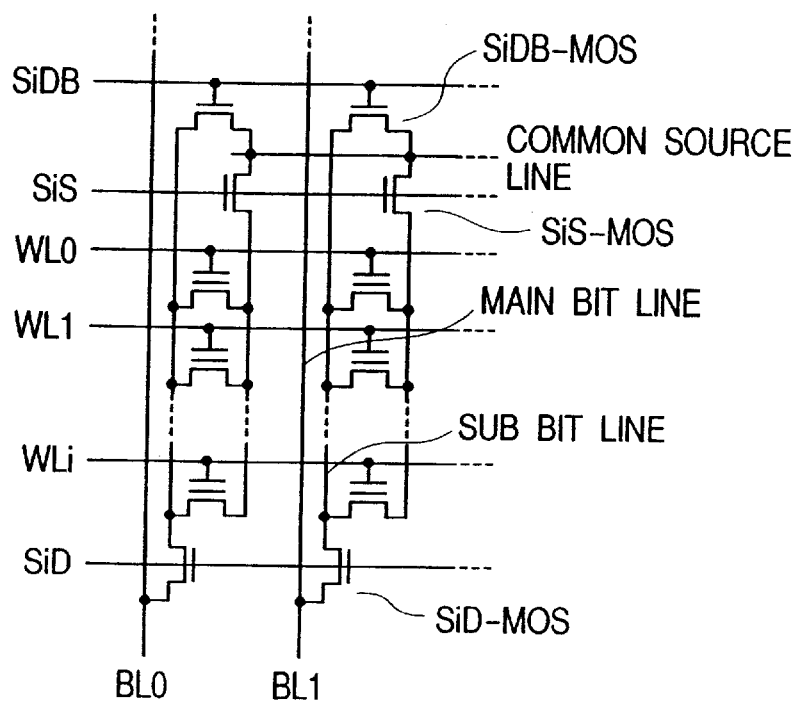
Figure 13:
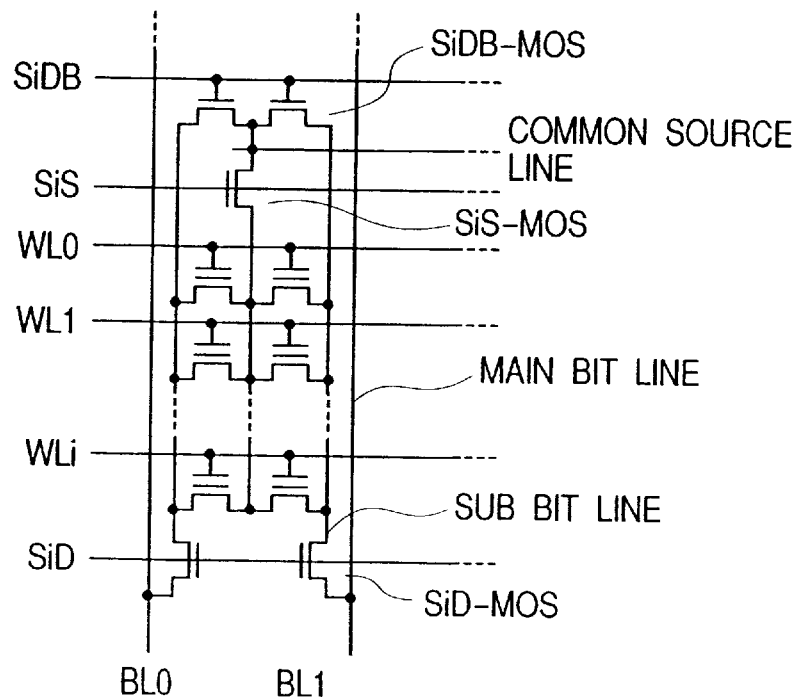
FIG. 13 is a circuit diagram indicating how memory cells are connected to each other when the present invention is applied to the memory cell connection method HICR.
Figure 14:
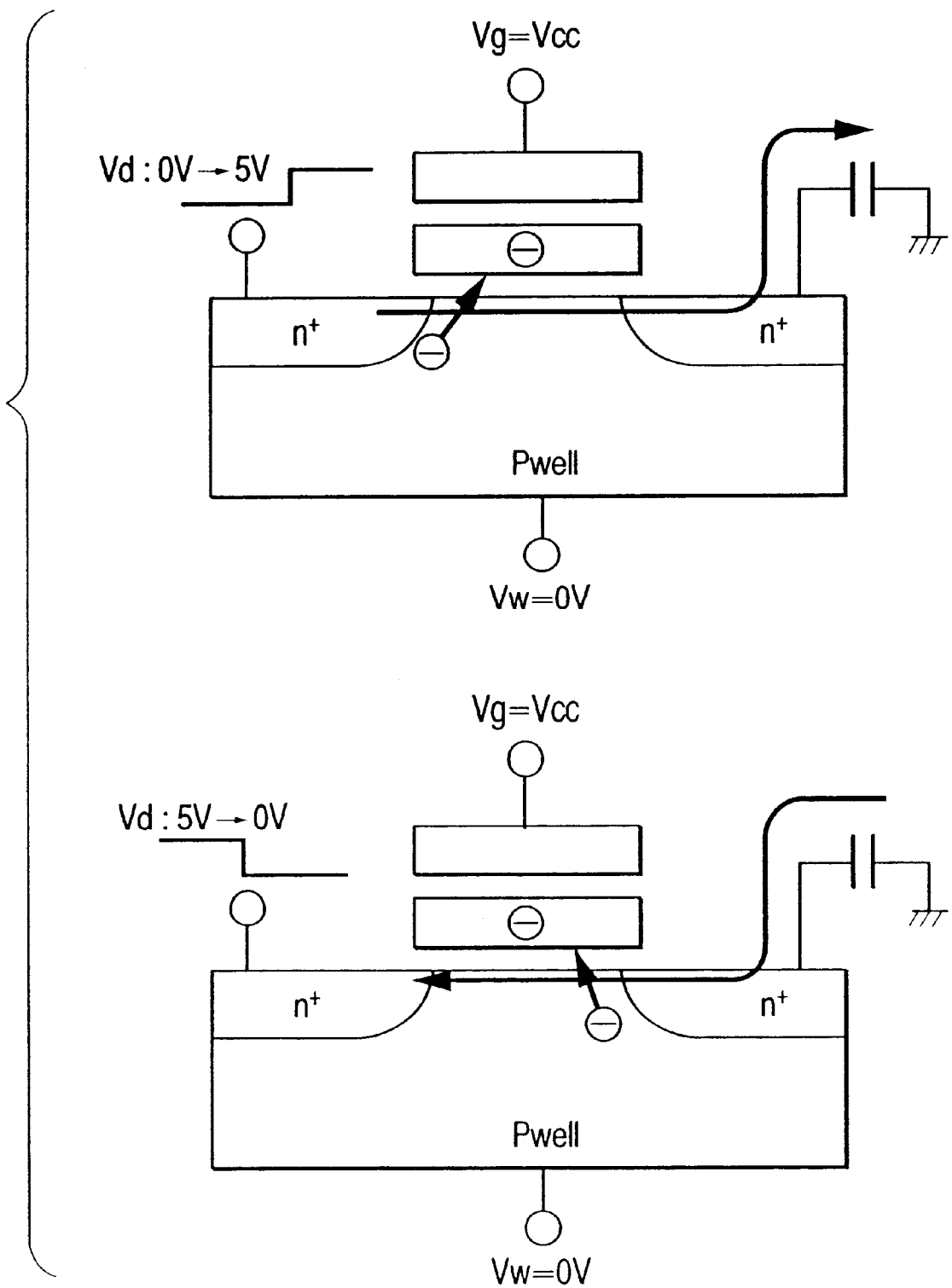
FIG. 14 is a cross sectional view of a memory cell in which a charging current is generated in a rewriting operation for the memory cell.
Figure 15:
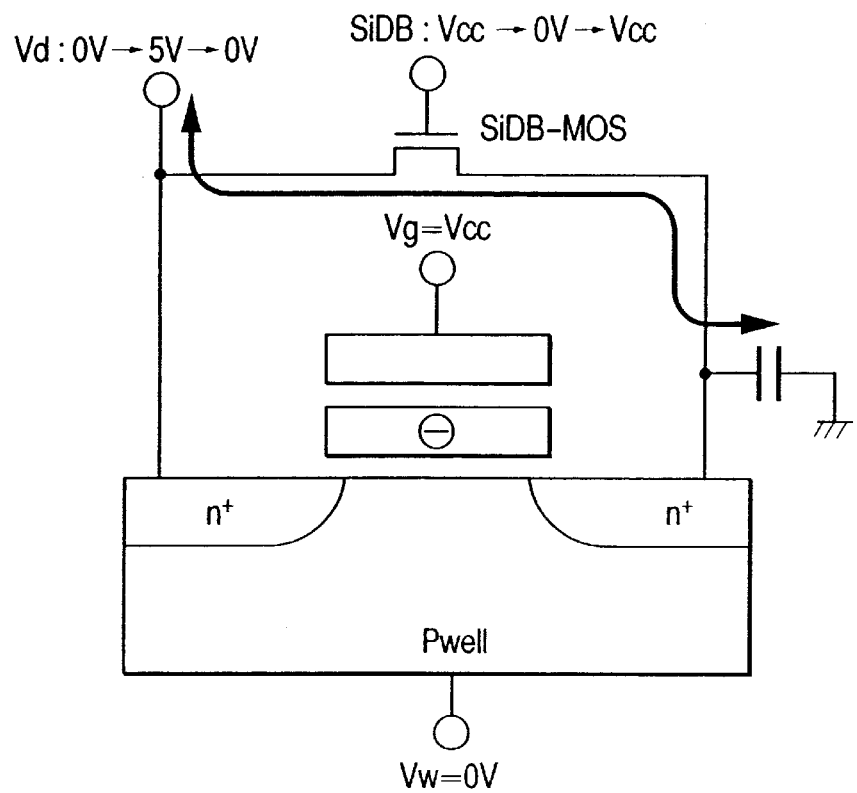
FIG. 15 is a cross sectional view of a memory cell for which a corrective measure is taken for a charging current generated in a rewriting operation for the memory cell related to the present invention.
Figure 16:
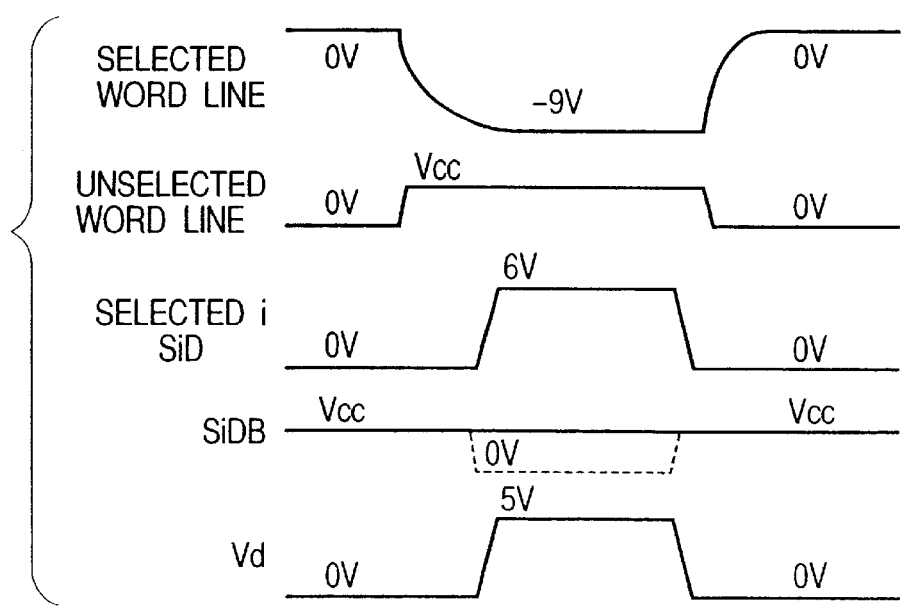
FIG. 16 is a timing waveform of a rewriting operation for a memory cell related to the present invention.
Figure 17:
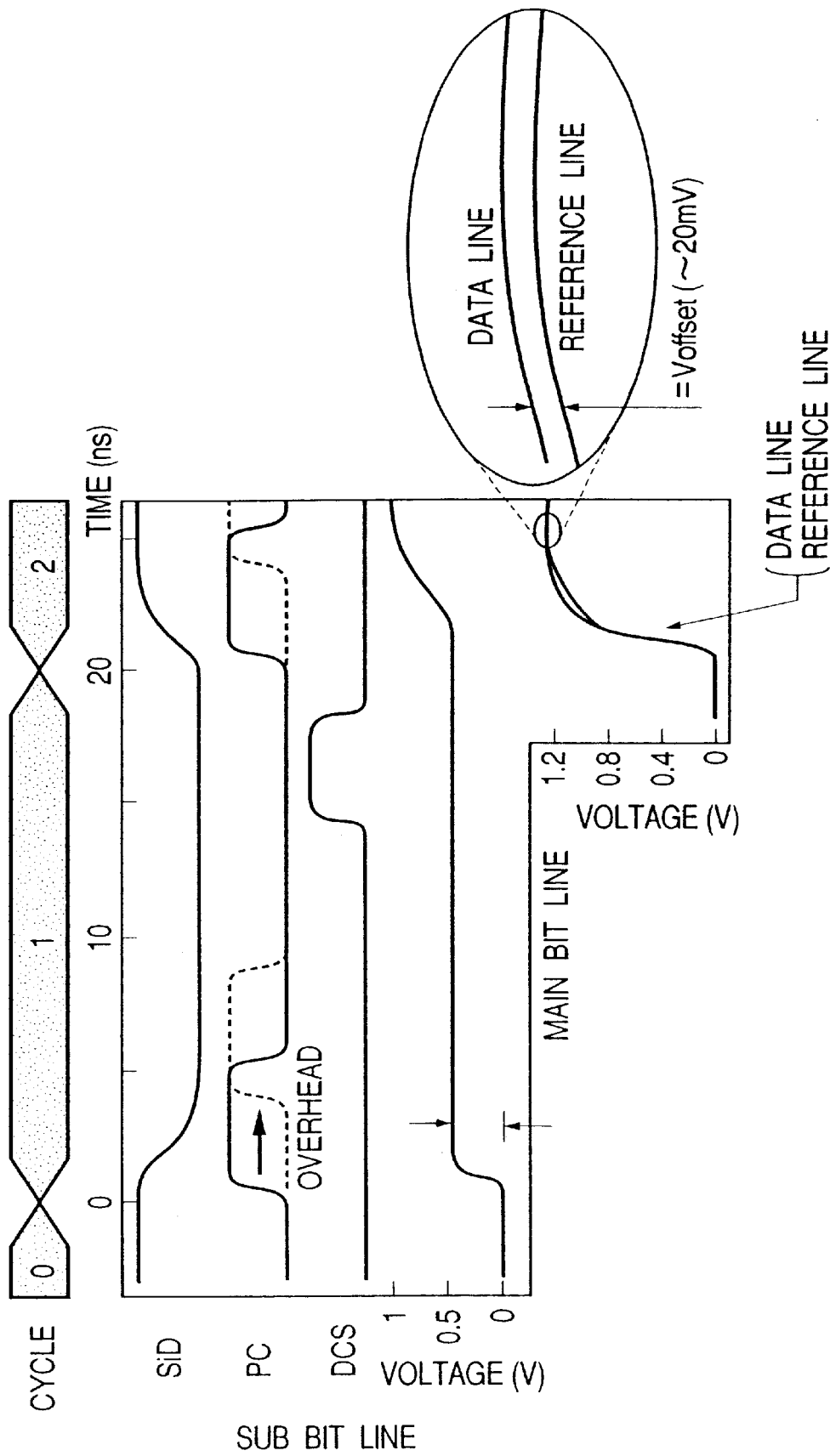
FIG. 17 is potential waveforms of a main bit line, a sub bit line, etc. executed a precedence pre-charge in a conventional read operation.
Figure 18:
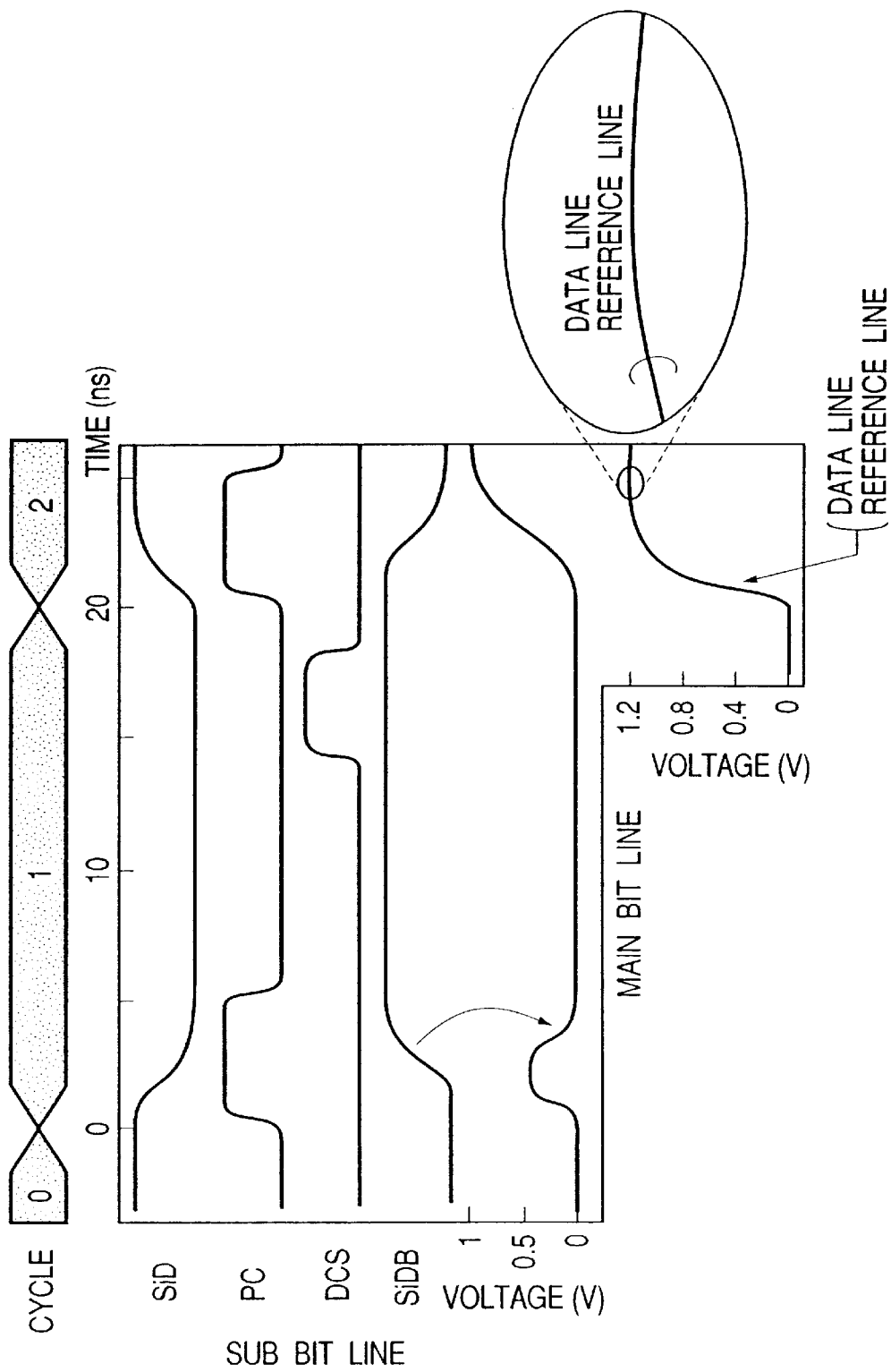
FIG. 18 is potential waveforms of a main bit line, a sub bit line, etc. executed a precedence pre-charge in the present invention.
Figure 19:
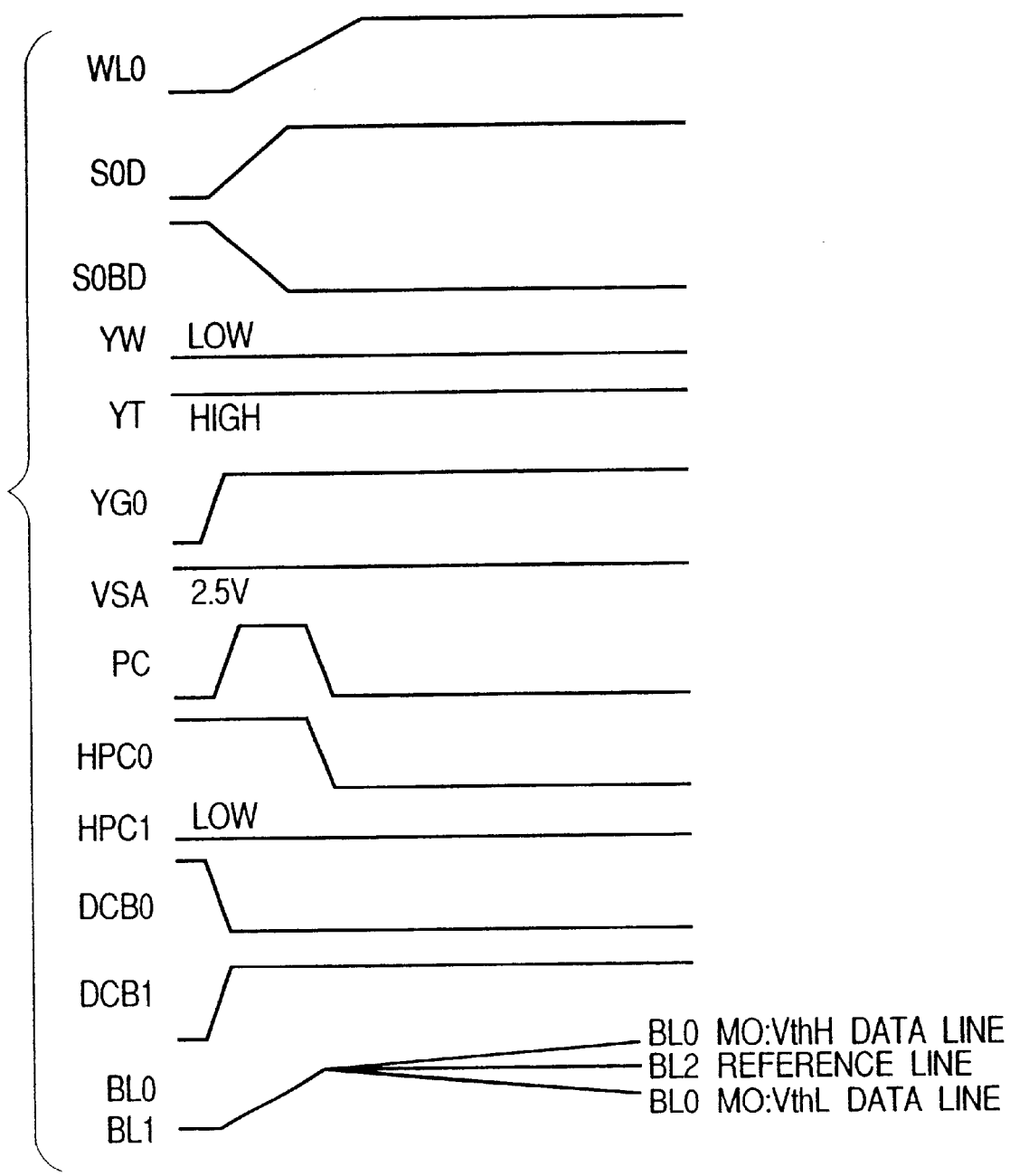
FIG. 19 shows timing waveforms showing the method of the precedence pre-charge of the present invention.
Figure 20:
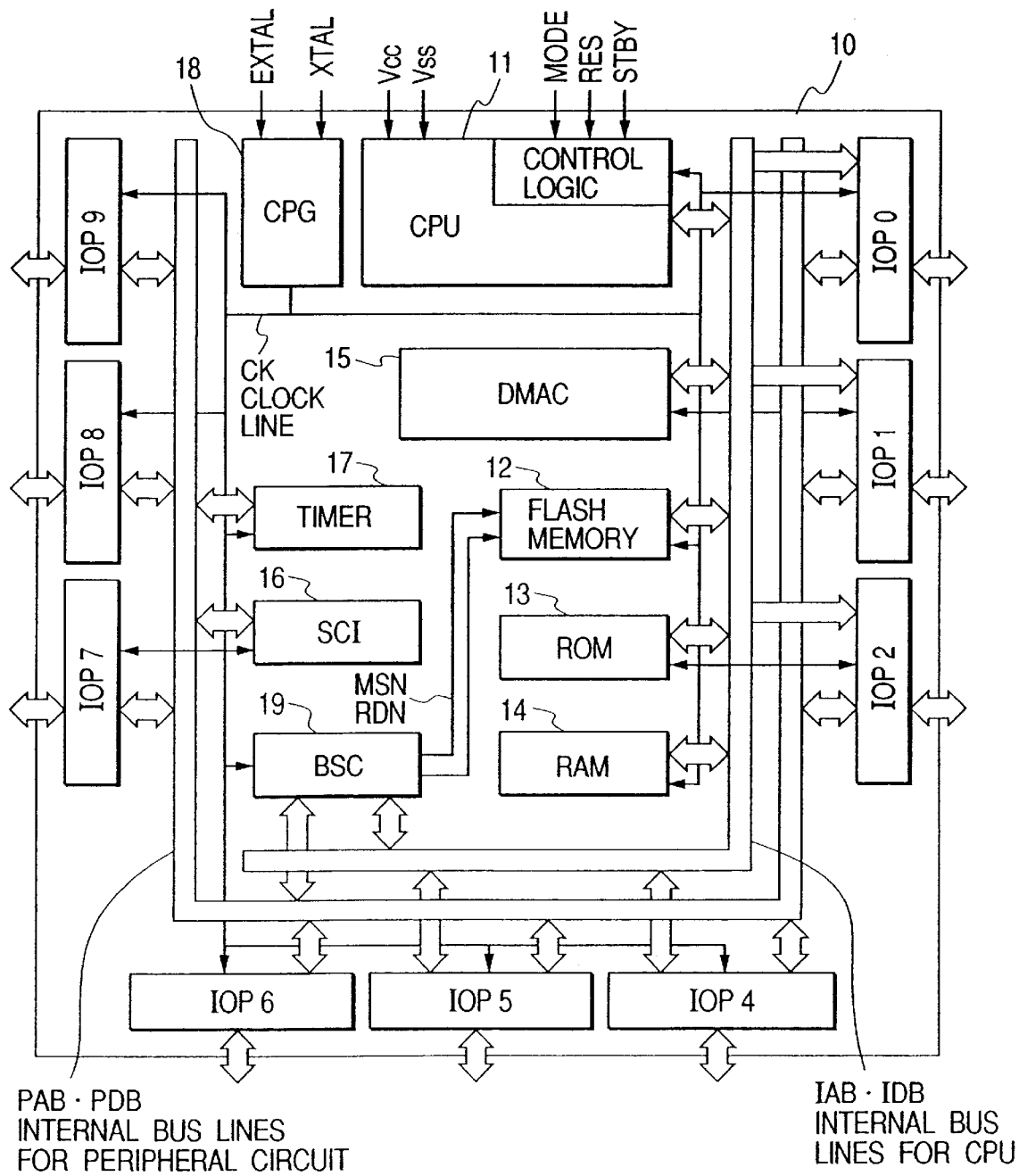
FIG. 20 is a functional block diagram of a single chip microcomputer incorporating a semiconductor non-volatile storage in the embodiment of the present invention.
Figure 21:
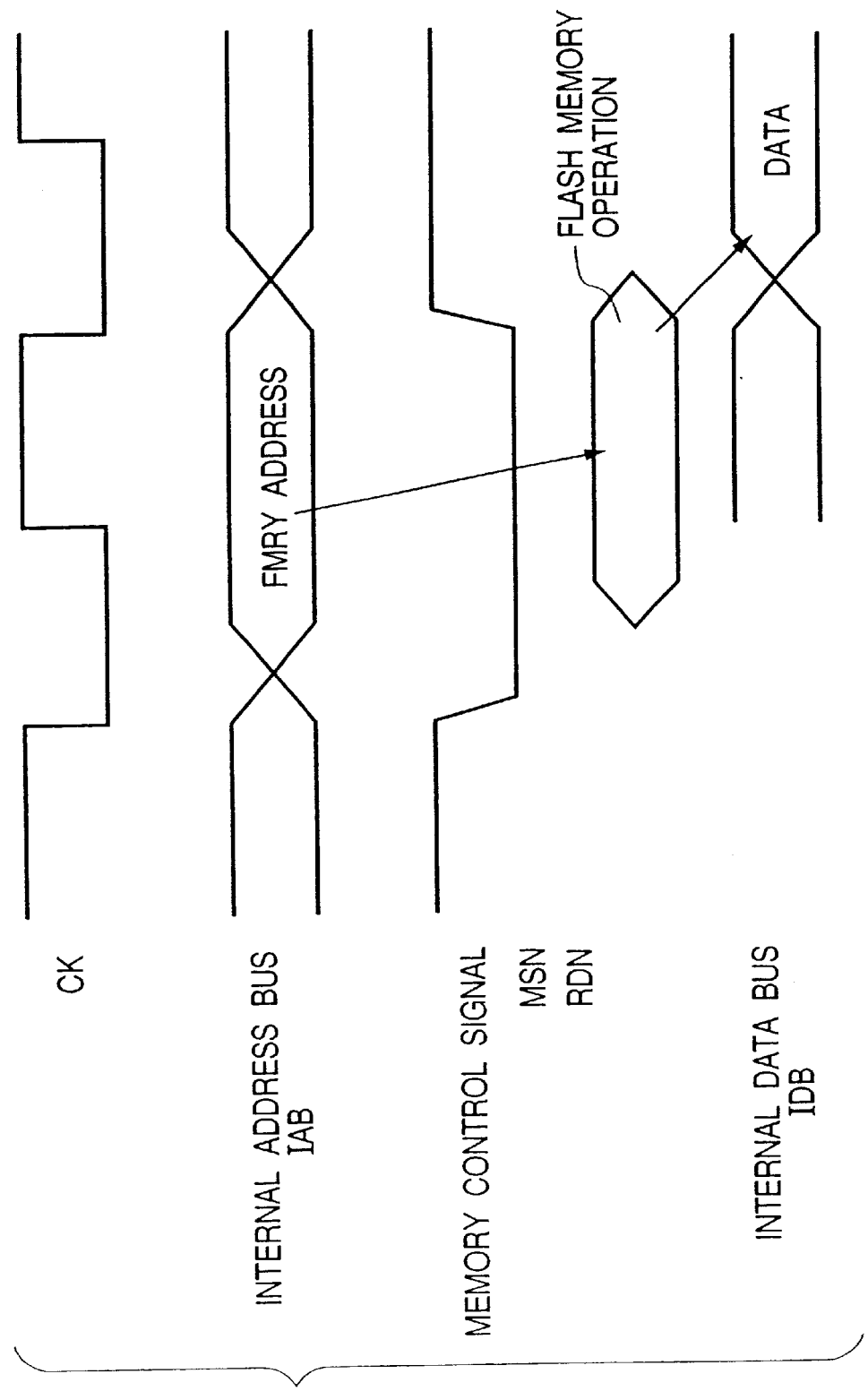
FIG. 21 illustrates a read operation executed for a semiconductor non-volatile storage incorporated in a single chip microcomputer in the embodiment of the present invention.
Figure 22:
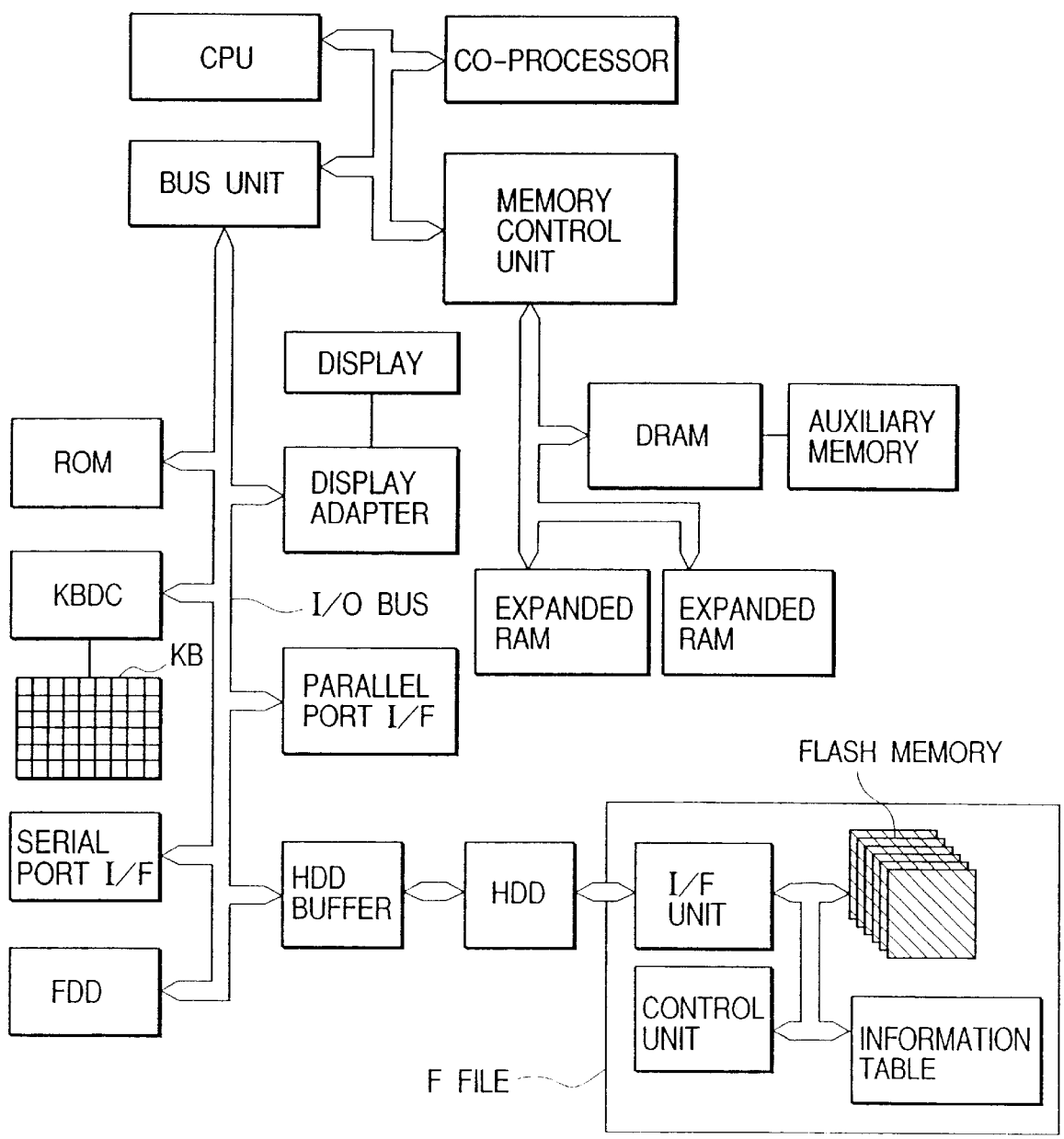
FIG. 22 is a functional block diagram of a computer system that uses a semiconductor non-volatile storage in the embodiment of the present invention.
Figure 23:
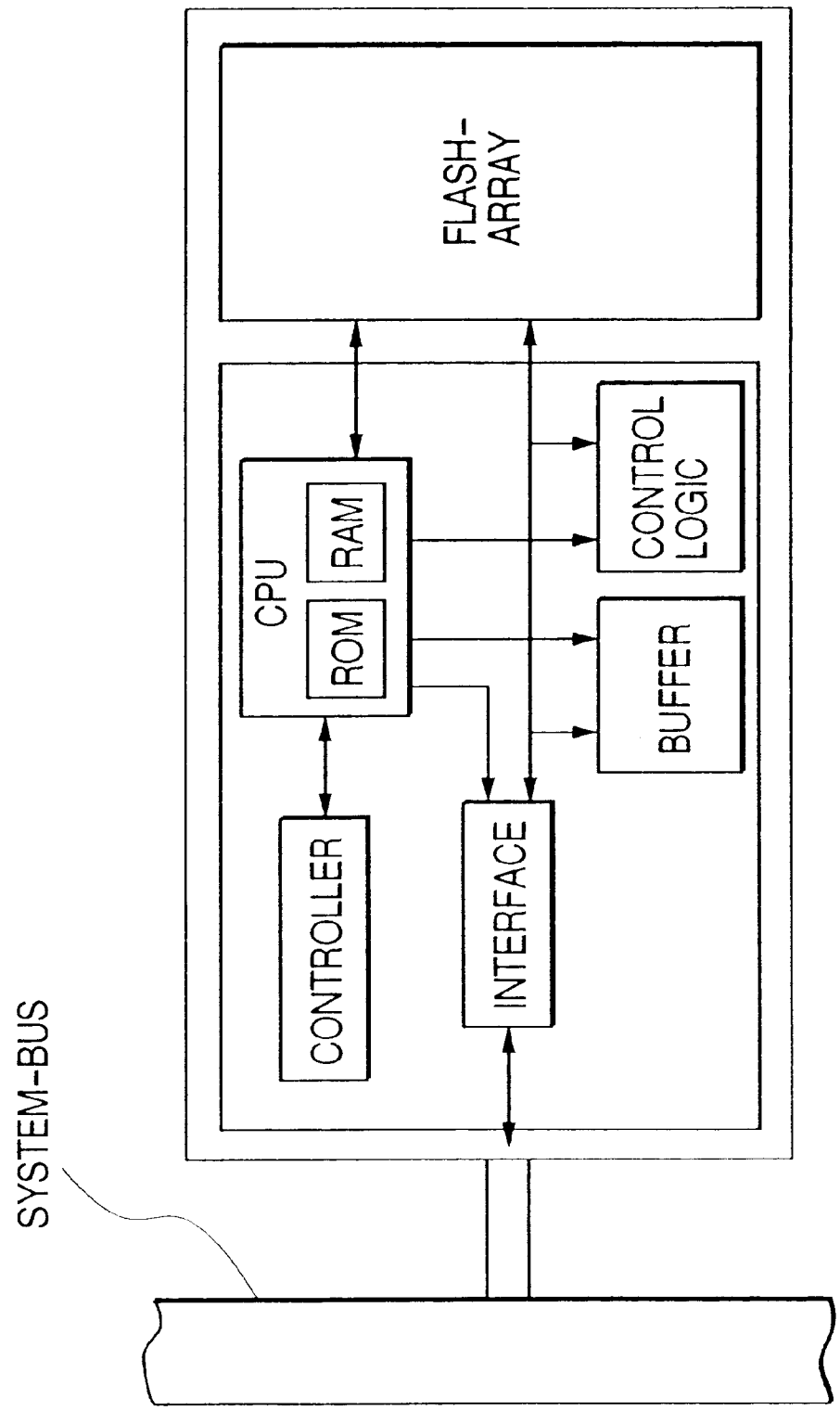
FIG. 23 is a functional block diagram of a card system that uses a semiconductor non-volatile storage in the embodiment of the present invention.

FIG. 1 shows connections of memory cells to each other, a memory array configuration, and the relationship between connections of the differential sense amplifier and other circuits in a semiconductor non-volatile storage in the embodiment of the present invention and in the semiconductor non-volatile storage incorporated in a single chip microcomputer in order to describe the principle of the present invention. FIG. 2 shows a schematic view of the SiD waveform to appear in a conventional read operation and the outline of the signal function in the read operation. FIG. 3 shows the SiD waveform, the SiDB-MOS waveform, as well as the functions of those signals in a read operation in the embodiment of the present invention. FIG. 4 is a functional block diagram of a semiconductor non-volatile storage in the embodiment of the present invention. FIG. 5 is a functional block diagram of a power supply circuit built in the semiconductor non-volatile storage. FIGS. 6 and 7 are cross sectional views of a transistor used in a semiconductor non-volatile memory cell. FIGS. 8 to 10 are circuit diagrams indicating connecting methods of memory cells composing a conventional memory array. FIGS. 11 to 13 are circuit diagrams indicating connection methods in the embodiment of the present invention. FIG. 14 shows a typical cross sectional view of a memory cell with respect to a charging current generated in a rewriting operation in a memory cell. FIG. 15 shows a typical cross sectional view of a memory cell for which a corrective measure of the present invention is taken with respect to the charging current. FIG. 16 shows the timing waveform. FIG. 17 shows potential waveforms of a main bit line, a sub bit line, etc. in the conventional technology. FIG. 18 shows potential waveforms of a main bit line, a sub bit line, etc. in the present invention. FIG. 19 shows the timing waveforms in the present invention. FIG. 20 is a functional block diagram of a single chip microcomputer incorporating a semiconductor non-volatile storage. FIG. 21 shows a read operation executed in such a single chip microcomputer. FIG. 22 is a functional block diagram of a computer system that uses a semiconductor non-volatile storage. FIG. 23 is a functional block diagram of a card system that uses a semiconductor non-volatile storage.

At first, a configuration of the semiconductor non-volatile storage in the embodiment of the present invention will be described with reference to FIG. 4. The semiconductor non-volatile storage in this embodiment is, for example, a flash memory composed of memory arrays, each being composed of, for example, transistors whose threshold voltage is rewritable electrically. Concretely, the semiconductor non-volatile storage comprises memory arrays, a row address buffer XADB, a row address decoder XDCR, a data latch circuit DL, a sense amplifier circuit SA, the first column gate array circuit YG-Gate, the second column gate array circuit YW-Gate, the third column gate array circuit YT-Gate, a column address buffer YADB, a column address decoder YDCR, a source/channel potential switching circuit SVC, an input buffer circuit DIB, an output buffer circuit DOB, a multiplexer circuit MP, a mode control circuit MC, a control signal buffer circuit CSB, an internal power supply circuit VS, etc.

In this semiconductor non-volatile storage, the control signal buffer circuit CSB receives, for example, the chip enable signal, the output enable signal, the write enable signal, the serial clock signal, etc., which are supplied to the external terminals /CE, /OE, /WE, SC, etc. Those input signals to the control signal buffer circuit CSB are not limited specially. According to those input signals, the semiconductor non-volatile storage generates timing signals of the internal control signals. The mode control circuit MC outputs the ready and busy signals to the external terminal R/(/B). Each "/" inthe signals /CE, /OE, /WE, etc. in this embodiment indicates that the object signal is a complementary signal.

The internal power supply circuit VS receives, for example, the supply voltage Vcc from external, thereby to generate the read word line voltage Vrw, the write word line voltage Vww, the write verify word line voltage Vwv corresponding to the low threshold voltage VthL, the erasure word line voltage Vew, the erasure verify word line voltage Vev corresponding to the high threshold voltage VthH, the erasure channel source voltage Vec, the write drain terminal voltage Vwd, the sense amplifier circuit voltage VSA, the write drain voltage transfer voltage Vwt, etc. Each of the above voltages may be supplied from external, although they are not limited so specially.

Of the voltages generated in this power supply circuit VS, the read word line voltage Vrw, the write word line voltage Vww, the write verify word line voltage Vwv, the erase word line voltage Vew, the erase verify word line voltage Vev, and the write drain voltage transfer voltage Vwt are entered to the column address decoder XDCR and the erase channel source voltage Vec is entered to the source/channel potential switching circuit SVC, and the write drain terminal voltage Vwd is entered to the data latch circuit DL, and the sense amplifier circuit voltage VSA is entered to the sense amplifier circuit SA, and the write drain voltage transfer voltage Vwt is entered to the column gate array circuits YW-Gate and YT-Gate respectively.

In FIG. 4, the sense amplifier circuit SA includes transistors that receive signals PC, HPC0, HPC1, and DCS shown in FIG. 1 through their gates. The third column gate array circuit YT-Gate includes transistors that receive DCB0 and DCB1 through their gates.

In this semiconductor non-volatile storage, complementary address signals generated through the row and column address buffers XADB and YADB are supplied to the row and column address decoders XDCR and YDCR. The row and column address buffers XADB and YADB receive the row and column address signals AX and AY supplied from external terminals. The row and column address buffers XADB and YADB are activated, for example, by the chip enable select signal. The select signal is provided in the storage, thereby fetching the address signals AX and AY from an external terminal to generate complementary signals, which is composed of an address signal whose phase is the same as that of an address signal supplied from an external terminal and another address signal whose phase is reversed from the other address signal from the external terminal, although it is not limited so specially.

The row address decoder XDCR generates a select signal used for the word lines WL of the memory cell group in accordance with the complementary address signal of the row address buffer XADB. The column address decoder YDCR generates a select signal used for the bit lines BL of the memory cell group in accordance with the complementary address signal of the row address buffer YADB. Consequently, a given word line WL and a given bit line BL are specified in a memory array, thereby selecting a required memory cell.

Although not restricted specially, memory cells are selected in units of 8, 16, or 32 cells by the row address decoder XDCR and the column address decoder YDCR to write/read data in units of 8, 16, or 32 bits. If a data block comprises X memory cells in the word line direction (row) and Y memory cells in the data line direction (column), the storage comprises 8, 16, or 32 data blocks composed of X×Y memory cells respectively.

In this embodiment, the internal power supply circuit VS generates a proper voltage as follows: If the supply voltage of the power supply circuit VS is lower than the external supply voltage Vcc, a resistor or a MOS transistor is used to divide the external supply voltage Vcc and if the supply voltage is higher than the Vcc, a booster pump circuit is used to increase the voltage.

Next, description will be made for a data block configuration when a certain accuracy is required for the internal supply voltage with reference to FIG. 5. The internal power supply circuit VS is composed of a reference voltage generator, a voltage lowering circuit, a booster pump circuit, a limiter circuit, and a power supply switching circuit. The output supply voltage is connected to, for example, the voltage transformer and the driver in the row address decoder XDCR used to select a word line WL. The output supply voltage is controlled by the mode control circuit MC. The voltage accuracy of the write verify word line voltage Vwv can be improved using the reference voltage of the reference voltage generator for the voltage lowering circuit composed of a current mirror circuit, etc. The voltage accuracy of the word line voltage Vev that verifies a high threshold voltage of memory cells can be improved by generating a voltage in the booster pump circuit, then using the reference voltage from the reference voltage generator for the limiter circuit.

It is also possible to improve the accuracy of the supply voltage VSA of a transistor that generates a current for both pre-charging and ½ currents in a reading operation by using the reference voltage from the reference voltage generator for the voltage lowering circuit composed of a current mirror circuit, etc. just as in the case of the voltage generated from the write verify word line voltage Vwv.

Although not restricted specially, each of the memory cells is composed similarly to, for example, an EPROM memory cell; it is a well-known memory cell including a control gate and a floating gate or a well-known memory cell including a control gate, a floating gate, and a selection gate. In this embodiment, the memory cell is assumed to have a control gate and a floating gate.

The memory cell shown in FIG. 6 is structured as a stack type memory cell.

FIG. 7 shows a structure of a split type memory cell. Although not restricted specially, such a memory cell is formed on a semiconductor substrate made of, for example, single crystal P-type silicon.

In other words, this non-volatile memory cell, which is a flash erasable EEPROM cell, as shown in FIGS. 6 and 7, is composed of elements of a transistor. The elements are a word line electrode 1, a drain electrode 2, a source electrode 3, a substrate electrode 4, a control gate 5, a floating gate 6, a high-impurity concentration N-type diffusion layer 7 in a drain/source area, an interlayer insulating film 8, a tunnel insulating film 9, and a P-type substrate 10.

As for a memory cell group composed of a plurality of memory cells connected to each other, there have been proposed various memory cells connection examples. Although not restricted specially, there are the DINOR connection method, the AND connection method, the HICR connection method, etc. as shown in FIGS. 8 to 10. Unlike those memory cell connection examples described above, a transistor SiDB-MOS of the present invention is connected to a sub bit line. The transistor SiDB-MOS is used to discharge the sub bit line.

The memory cell connection methods shown in FIGS. 11 to 13 correspond to those of the present invention shown in FIGS.8 to 10. Memory connection methods are not limited only to them. The present invention can also be applied for other connection methods including a transistor SiD-MOS in which main bit and sub bit lines are formed hierarchically.

FIG. 8 shows the DINOR memory cell connection method. A transistor SiD-MOS in which bit lines are formed hierarchically is not included in a memory cell, but included in another part. The gate terminal of the MOS transistor in each memory cell is connected to the word lines WL0 to Wli and each drain terminal of the memory cell group is connected to a sub bit line, then connected to the bit lines BL0 to BL2 via a transistor SiD-MOS in which bit lines are formed hierarchically. The source terminal of the memory cell is connected to the common source line. FIG. 11 shows a memory cell connection method obtained by applying the present invention to the DINOR memory cell connection method. A transistor SiDB-MOS is connected to both sub bit line and source of each memory cell.

FIG. 9 shows an AND connection method example. A transistor SiD-MOS and a transistor SiS-MOS are connected to the drain and source terminals of a memory cell respectively. In the SiD-MOS are formed main bit and sub bit lines hierarchically and in the SiS-MOS transistor are formed a common source line and the sub source lines of a memory cell group hierarchically. FIG. 12 shows a connection method obtained by applying the present invention to the AND connection method. This method allows a transistor SiDB-MOS to be connected to sub bit lines and the sub source lines of a memory cell group FIG. 10 shows a memory cell connection example using the HICR connection method. The sub-source lines of adjacent memory cell groups are used commonly. FIG. 13 shows a connection method obtained by applying the present invention to the HICR connection method. This method allows a transistor SiDB-MOS to be connected to sub bit lines and common sub-source lines of adjacent memory cell groups.

Hereunder, description will be made to clear how memory cells are connected to each other with reference to FIG. 1 and FIG. 4. FIG. 1 shows a memory cell connection method obtained by applying the present invention to the DINOR connection method and FIG. 4 shows a configuration of the semiconductor non-volatile storage of the present invention. A memory array is composed of memory cells MOSM0 to M15, word lines WL0 to WL3, bit lines BL0 to BL3, gate signal lines S0D to S1D of a transistor SiD-MOS in which bit lines are formed hierarchically, gate signal lines S0DB to S1DB of a transistor SiDB-MOS connected to a sub bit line and the source line of a memory cell, and a common source line. The potentials of both common source line and well of memory cell array are switched by the source/channel potential switching circuit SVC. In a memory array shown in FIG. 1, control gates of the memory cells disposed in the same row, for example, M0, M2, M4, and M6, are connected to the same word line WL0. The drains of the memory cells disposed in the same column, for example, M0 and M1, are connected to the same bit line BL0 through a transistor SiD-MOS whose gate signal is S0D. The drains of the memory cells M8 and M9 are also connected to the same bit line BL0 through a transistor SiD-MOS whose gate signal is SiD.

The relationship between a memory cell group and the gate signal of a transistor SiD-MOS is as shown below. The sub bit lines of the memory cell groups M0 and M1, the memory cell groups M6 and M7, the memory cell groups M10 and M11, and the memory cell groups M12 and M13 are connected to the bit lines BL0, BL3, BL1, and BL2 through transistors SiD-MOS whose gate signal is S0D respectively. The sub bit lines of the memory cell groups M2 and M3, the memory cell groups M4 and M5, the memory cell groups M8 and M9, and the memory cell groups M14 and M15 are connected to the bit lines BL1, BL2, BL0, and BL3 through transistors SiD-MOS whose gate signal is SID respectively.

As shown clearly in FIG. 1, the gate signal of the transistor SiDB-MOS used to connect the sub bit lines of those memory cell groups to the sources of the respective memory cells is a complementary signal of the gate signal of the transistor SiD-MOS used to connect the sub bit lines to the bit lines of the memory cell groups.

A transistor YW-MOS, whose gate signal is the control signal YW, is connected to one side of the main bit lines BL0 to BL3. Through the YW-MOS transistor, the data latch circuit DL used to hold memory cell write information is also connected to one side of the main bit lines BL0 to BL3. To the other side of the bit lines BL0 to BL3 is connected a transistor YT-MOS, whose gate signal is the control signal YT, which is used to prevent a bit line potential from being transmitted to the sense amplifier circuit SA, etc. in a writing process. In addition, the sense amplifier SA is also connected to the other side of the bit lines BL0 to BL3 through the column select switch YG-MOS used to receive a select signal generated by the column address decoder YDCR. The transistors YW-MOS and YT-MOS are composed of a transistor that can apply a high voltage respectively.

In FIG. 4, the external terminal of the write data input buffer DIB is connected to a data input/output line through a switch MOS that receives a write control signal, which is activated in writing operation. The write data input buffer DIB receives a write signal entered from the external terminal I/O through the multiplexer MP. Write information is thus transferred to the data latch circuit DL through a main bit line and held there. In this writing operation, the supply voltage of the data latch circuit DL is assumed as the drain terminal voltage of the object memory cell, then data is written in the memory cell according to the entered information.

In reading operation, the sense amplifier circuit SA is activated, then connected to the external terminal I/O through the read data output buffer DOB and the multiplexer MP.

A memory cell whose threshold level is high has electrons accumulated at its floating gate, so no drain current flows in the memory cell even when a select potential is applied to the control gate, that is, the word line WL. On the other hand, if no electrons are injected to the floating gate, the threshold level of the memory cell is low. If a select potential is applied to the word line WL, therefore, a current flows in the memory cell. This drain current can be read by the sense amplifier SA thereby to use the threshold level of the memory cell as the information of the storage.

Operation modes, for example, a read operation, a rewrite operation (erasure and write operations), are evoked by activating the chip enable and write enable signals /CE and /WE of the external terminal or entering data of the external terminal I/O, for example, commands such as read 00iH, erasure 20H, write 10H, etc. When an operation mode is selected, the necessary internal signal is generated in the control signal buffer CSB.

It is also possible to know an operation state from external using the status polling or read/busy signal; the operation status includes, for example, now under rewriting, end of rewriting, now under erasing, or now under writing. When in continuous reading of data in units of a sector and in writing operation of data (sector data) in units of a sector, data may be output and entered synchronously with a signal from the external terminal SC.

Hereunder, an erasing operation for the semiconductor storage of the present invention will be described. A voltage is applied to each selected memory cell as follows; about 10V is applied to the control gate and about –9V is applied to the well and the source of a memory cell. Then, a voltage difference is generated between the floating gate and the channel, thereby the electrons in the channel are injected into the floating gate due to the Fowler-Nordheim tunnel phenomenon. The drain terminal of the memory cell is opened to prevent a steady-state current from flowing through the memory cell. In FIG. 4, the voltage applied to the address decoder XDCR is the erasure word line voltage Vew, and the erasure channel/source voltage Vec is supplied to the source/channel potential switching circuit SVC. The gate signal of the transistor SiD-MOS in which bit lines are formed hierarchically receives a negative voltage, which is the erasure channel/source voltage Vec. The gate signal of the transistor SiDB-MOS provided between a sub bit line and a memory cell source receives the same voltage as the ground voltage VSS (0V).

Consequently, it is possible to set the threshold level of the memory cell to Vrw or over in an erasing operation. The Vrw is the select word line voltage assumed in a reading operation. When in an erasing operation, data is erased in some steps, so that an erasure pulse is applied to the memory cell repetitively. After each pulse applying, the threshold voltage of the memory cell is verified (erasure verify). The erasure verifying word line voltage Vev is set to about 5V, for example.

In writing operation, a negative voltage of about –9V is applied to the control gate and about 5V is applied to the drain terminal of the object memory cell selectively, thereby a voltage difference is generated between the floating gate and the drain of the memory cell. Then, the electrons in the floating gate are moved toward the drain due to the Fowler-Nordheim tunnel phenomenon. To prevent this, the ground voltage VSS (0V) is applied to the drain terminal of an unselected memory cell for a writing operation. It is thus suppressed that a voltage difference is generated between the floating gate and the drain, as well as the electrons are discharged from the floating gate. In FIG. 4, the write word line voltage Vww is applied to the address decoder XDCR. The write drain terminal voltage Vwd is supplied to the data latch circuit DL. About 6V is applied to the gate signal of the transistor SiD-MOS in which bit lines are formed hierarchically, for example, considering the threshold level voltage of the SiD-MOS itself. The ground voltage VSS (0V) is applied to the gate signal of the transistor SiDB-MOS provided between a sub bit line and the source of the memory cell just like in the erasing operation.

Consequently, it is possible to set the threshold level voltage of the memory cell to Vrw or under writing operation. The Vrw is a voltage of a selected word line taken in reading operation. In writing operation, data is written in some steps so that a write pulse is applied to the object memory cell repetitively just like in an erasing operation. After each writing operation, the threshold level voltage of the memory cell is verified (write verify). The write verifying word line voltage Vwv is set to about 2V, for example.

When in rewriting (writing or erasing) for a memory cell, if a voltage is applied to the drain or source terminal of the memory cell, the charging/discharging current flows in the memory cell. The current is equivalent to the total parasitic capacity of both drain and source of the memory cell as shown in FIG. 14. This is only when the voltage of the word line, that is, the control gate is positive. At this moment, hot electrons are generated and injected into the floating gate, thereby the threshold level voltage of the memory cell is changed. Consequently, the electrons pass through the tunnel film of the memory cell, damaging the tunnel film.

FIG. 15 shows how data in a memory cell is rewritten using a transistor SiDB-MOS of the present invention, disposed between a sub bit line and the source terminal of a memory cell. While a voltage is applied to the drain or source terminal of the memory cell, the transistor SiDB-MOS allows the drain terminal and the source terminal of the memory cell to be connected to each other, thereby preventing the charging/discharging current from flowing in the memory cell. The charging/discharging current capacity is equal to the total parasitic capacity of both drain and source of the memory cell.

FIG. 16 shows timing waveforms to appear in a writing operation for discharging electrons toward the drain. The gate signal SiDB is activated and both drain and source terminals of the memory cell are connected to each other at least when a voltage is applied to and shut off from the memory cell.

Since a transistor SiDB-MOS disposed between a sub bit line and the source terminal of the memory cell is used for rewriting (writing, erasing) the memory cell, it is prevented to flow a charging/discharging current in the memory cell, thereby suppressing changes of the threshold level voltage of the memory cell. Consequently, fast and stable reading operations are assured. The charging/discharging current capacity is equal to the total parasitic capacity of both drain and source of the memory cell.

FIG. 17 shows potential waveforms of main bit and sub bit lines, etc. executed a precedence pre-charge step in a read operation as shown in FIG. 8 indicating a conventional memory cell connection method. If the pre-charge signal PC is activated in the next read cycle 1 while the gate signal SiD of the transistor SiD-MOS connecting both bit and sub bit lines is not shut off completely, the voltage of the sub bit line rises by about 0.5V. In the next read cycle 2, therefore, a voltage difference is generated between the data line and the reference line of the differential sense amplifier. This voltage difference affects the read operation, making fast read operations unstable. Consequently, starting of the pre-charging must be suspended until the SiD signal is activated. This suspended time becomes an overhead time FIG. 18 shows potential waveforms of both main bit and sub bit lines executed a precedence pre-charge step, in a read operation through a memory cell connection method using a transistor SiDB-MOS of the present invention for discharging the sub bit line. The voltage of the sub bit line rises once due to the pre-charge signal PC in the read cycle 1. However, since the gate signal SiDB of the transistor SiDB-MOS used to discharge the sub bit line is activated, the voltage of the sub bit line returns to the ground voltage VSS again through the transistor SiDB-MOS. Consequently, no voltage difference is generated between the data line and the reference line of the differential sense amplifier in the next read cycle 2.

Since pre-charging is started before the SiD signal is activated such way, that is, by using a precedence pre-charge method, the read operation cycle can be shortened, thereby enabling fast operations.

FIG. 19 shows timing waveforms of the signal lines needed for a read operation as shown in FIG. 1. The waveforms appear when a read operation is started. When in a read operation, the gate signal YW of the transistor YW-MOS is deactivated and the gate signal YT of the transistor YT-MOS is activated. The transistors YW-MOS and YT-MOS are provided at both ends of the main bit lines BL0 to BL3 shown in FIG. 1. The supply voltage of the pre-charging and ½ currents generator becomes about 2.5V, which is the stabilized supply voltage generated inside the storage independent of the external voltage VCC. The pre-charge signal PC is activated at the same timing as that of the YG-Gate selection according to a column address input. At this time, the gate signal DCB0 of the transistor that sets the voltage of the main bit line to the ground voltage VSS is deactivated. In other words, the ground voltage VSS is set for the main bit line other than the data line assumed as the input to the differential sense amplifier and the reference line. Consequently, the potential of the main bit line adjacent to the data and reference lines is the same as that of the ground voltage VSS and given a constantly stabilized load capacity. Both data and reference lines are thus pre-charged.

When the pre-charge signal PC is deactivated, the gate signal HPCO is activated. The gate signal HPCO is of a transistor that applies an about ½ current of that of the object memory cell to the data line in the direction for denying the memory cell current. This timing may be set while the pre-charge signal PC is still active. After this, the gate signal SiD of the transistor in which main and sub bit lines are formed hierarchically is activated and the transistor SiDB-MOS used to discharge the sub bit line is deactivated.

The voltage of the main bit line thus becomes lower than the pre-charge voltage due to the current obtained by reducing the memory cell current to ½ while the threshold level voltage of the object memory cell M0 is low (state VthL) If the threshold level voltage of the object memory cell M0 is high (state VthH), a ½ current flows in the memory cell and the voltage of the main bit line becomes higher than the pre-charge voltage. A stable fast read operation is thus confirmed by comparing the voltage of this data line (BL0) with the pre-charge voltage of the reference line (BL2).

The present invention, as described concretely in the above embodiment, may be modified freely as long as the concept is not overstepped.

For example, although the semiconductor non-volatile storage in the above embodiment is applied to a flash memory, the present invention may also be applied to other non-volatile semiconductor storages such as EEPROM, EPROM, etc., which can be rewritten electrically.

FIG. 20 shows a block diagram of a preferred single chip microcomputer to which the present invention is applied. In FIG. 20, a numeral 11 is a CPU (Central Processing Unit) and 12 is a flash memory, which is the semiconductor non-volatile storage described in the above embodiment. A numeral 13 is a ROM used for storing programs and data to be executed by the CPU 11. A numeral 14 is a RAM used for storing results of operations executed by the CPU 11, as well as used as a working area of the CPU 11. A numeral 15 is a DMA controller used for controlling transfer of data in predetermined blocks between each of the above memories and an external main memory (a hard disk unit not illustrated in FIG. 20).

A numeral 16 is a serial communication interface circuit used for serial communications with an external device, 17 is a timer used by the CPU 21. A numeral 18 is a clock pulse generator provided with an oscillator and used for generating a system clock CK, and IOP1 to IOP9 are input/output ports of the semiconductor chip 10. The microcomputer in this embodiment is provided with a main address bus IAB and a main data bus IDB used for connecting the CPU 11 to memories 12, 13, 14, a DMA controller 15, and an I/O port IOP, as well as a peripheral address bus PAB and a peripheral data bus PDB used for connecting peripheral circuits such as a serial communication interface circuit 16 used for serial communications and the timer 17 to the input/output ports IOP1 to IOP9.

Furthermore, the microcomputer is provided with a bus sequence controller 19 used for controlling transfer of signals between the main address bus IAB and the main data bus IDB, and between the peripheral address bus PAB and the peripheral data bus PDB, as well as used for controlling the state of each bus. Although not restricted specially, all the input/output ports IOP1 to IOP9 are connected to the peripheral address bus PAB and the peripheral data bus PDB. However, only the input/output ports IOP1 to IOP5 are connected to the main address bus IAB and the main data bus IDB.

The CPU 11, the circuit blocks (12 to 19), and the buses (IAB, IDB, PAB, and PDB) are formed on a semiconductor chip 10 such as a single crystal silicon substrate.

FIG. 21 shows a read operation executed for the semiconductor non-volatile storage incorporating a single chip microcomputer described in this embodiment. Reading from the non-volatile storage corresponding to the system clock CK is enabled by the flash memory module select signal MSN and the read strobe signal RDN generated by the bus sequence controller 19 shown in FIG. 20.

In addition to be used as a single unit storage like a flash memory, the semiconductor non-volatile storage in this embodiment can be used widely as a storage for various systems such as computer systems, digital still cameras, car systems, etc. FIG. 22 shows a computer system that uses the semiconductor non-volatile storage. Hereunder, such a computer system will be described as an example.

In FIG. 22, this computer system comprises the following information devices; a central processing unit (CPU), an I/O bus formed in the information processing system, a bus unit, a memory control unit used for accessing fast memories such as the main memory and an extended memory, a DRAM used as the main memory, a ROM used for storing basic control programs, a keyboard controller KBDC provided with a keyboard connected at its front end, etc. In addition, the display adapter is connected to the I/O bus and a display is connected to the front end of the display adapter.

To the I/O bus are also connected a parallel port I/F, a serial port I/F such as a mouse, a floppy disk drive (FDD), and a buffer controller (HDD buffer) used for converting I/O bus data to HDD I/F data. The I/O bus is also connected to the bus from the memory controller unit, so that the extended RAM and the DRAM used as the main memory are connected to the I/O bus.

Next, the operation of the computer system will be described. If the computer system is powered and started up, the CPU accesses the ROM through the I/O bus thereby executing an initial diagnosis, then initialize the system memory. Then, the CPU loads the system program into the DRAM used as the main memory from an auxiliary storage. The CPU further instructs the HDD controller to access the hard disk unit (HDD)

Finishing the system program loading, the CPU goes to the next process according to the user's request. The user goes with processes by executing input/output operations through the keyboard controller (KBDC) and the display adapter connected to the I/O bus. The user makes the most use of the I/O unit connected to the parallel port I/F and the serial port I/F as needed.

If the main memory (DRAM) provided in the main unit of the computer system becomes low in capacity, the extended RAM is used as a supplement of the main memory. If the user wants to read/write a file, the user requests for accessing the auxiliary storage assuming the above hard disk unit (HDD) as an auxiliary storage. The flash file system composed of the flash memory of the present invention accesses the requested file data.

A semiconductor non-volatile storage such as a flash memory can thus be used widely as a flash file system for computer systems such way.

The semiconductor non-volatile storage of the present invention can also be used removably for a computer system such as lap-top personal computers, portable information terminals, etc.

FIG. 23 shows a PC card. The PC card comprises a central processing unit (CPU) composed of a ROM and a RAM, a flash array (FLASH-ARRAY) connected to the CPU so as to transmit/receive data to/from the CPU, a controller, a control logic circuit connected to the CPU so as to transmit data to the CPU, a buffer circuit, an interface circuit, etc.

This PC card can transmit/receive data to/from the flash array, the control logic circuit, the buffer circuit, and the interface circuit. The PC card, when set in the system body, can be connected to the system bus through the interface circuit.

For example, the CPU controls the entire system including interface controlling, rewrite and read operations controlling, arithmetic operation controlling, etc. using an 8-bit data format. The flash array is formed, for example, as a 32MB flash device array. One sector consists of a 512-byte data area and a 16-byte utility area. One device consists of 8192 sectors.

The controller is composed of a cell base IC or a discrete IC, etc. The controller is provided with a sector table composed of a DRAM or an SRAM. The control logic circuit generates timing and control signals and the buffer circuit is used to storing data temporarily in rewriting.

The semiconductor non-volatile storage of the present invention such as a flash memory can also be used for a PC card such way. Furthermore, this semiconductor non-volatile storage can be used widely for various systems that are rewritten electrically.

The semiconductor non-volatile storage of the present invention such as a flash memory can also be used widely as a flash file system for computer systems such way.

The typical effects of the present invention described above can be summarized as follows.

(1) An effective memory cell connection method is adopted. The method is carried out as follows: In addition to a transistor SiD-MOS used for connecting a main bit line to a sub bit line, another transistor SiDB-MOS is connected to the sub bit line to discharge the sub bit line. In reading operation, pre-charging of the bit line is started before the gate terminal signal of the SiD-MOS is selected, thereby the read operation cycle is shortened, enabling fast operations.

(2) Both read bit and reference bit lines of the differential sense amplifier are disposed in the same memory array, thereby enabling stable fast read operations.

(3) A transistor SiDB-MOS disposed between a sub bit line and the source terminal of a memory cell is used for rewriting (writing, erasing) the memory cell, thereby it is prevented that a charging/discharging current flows in the memory cell. The charging/discharging current is equal to the total parasitic capacity of both drain and source of the memory cell. It is thus possible to suppress the threshold level voltage of the memory cell from being changed, thereby enabling stable fast read operations.

We claim:

1. A non-volatile semiconductor storage, comprising:
    a plurality of main bit lines including first and second main bit lines;
    a plurality of sub bit lines including first and second sub bit lines;
    a differential sense amplifier connected to said first and second main bit lines;
    a first transistor disposed between said first main bit line and said first sub bit line;
    a second transistor disposed between said second main bit line and said second sub bit line;
    a plurality of word lines including first and second word lines;
    a common source line;
    a plurality of first memory cells each comprising a control gate, a drain terminal and a source terminal, wherein said control gate of said first memory cell is connected to said first word lines, said drain terminal of said first memory cell is connected to said first sub bit line and said source terminal of said first memory cell is connected to said common source line; and
    a plurality of second memory cells each comprising a control gate, a drain terminal and a source terminal, wherein said control gate of said second memory cell is connected to said second word line, said drain terminal of said second memory cell is connected to said second sub bit line and said source terminal of said second memory cell is connected to said common source line;
    wherein, when gate signals of said first and second transistors are activated, said first main bit line is a read bit line and said second main bit line is reference bit line, for reading a memory cell which is one of said first memory cells,
    wherein said differential sense amplifier executes a reading method characterized in that a current which is about ½ current of a memory cell current is applied only to said read bit line in a direction opposing said memory cell current while or after said read bit line and said reference bit line are pre-charged.

2. A non-volatile semiconductor storage according to claim 1, wherein
    a supply voltage of a circuit used for generating said ½ current is a stabilized supply voltage generated inside said storage independently of the external voltage Vcc.

* * * * *